US010756119B2

(12) United States Patent
Son et al.

(10) Patent No.: US 10,756,119 B2
(45) Date of Patent: Aug. 25, 2020

(54) DISPLAY DEVICE AND METHOD FOR MANUFACTURING SAME

(71) Applicant: SAMSUNG DISPLAY CO., LTD., Yongin-si (KR)

(72) Inventors: Euncheol Son, Cheonan-si (KR); Jinsic Min, Busan (KR); Jeongbong Lee, Hwaseong-si (KR); Yuji Kondo, Asan-si (KR); Kyeongyeol Heo, Cheonan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 310 days.

(21) Appl. No.: 15/439,397

(22) Filed: Feb. 22, 2017

(65) Prior Publication Data

US 2017/0309646 A1    Oct. 26, 2017

(30) Foreign Application Priority Data

Apr. 20, 2016 (KR) .......... 10-2016-0048360
Sep. 21, 2016 (KR) .......... 10-2016-0120946

(51) Int. Cl.
*H01L 27/12* (2006.01)
*G06F 3/0354* (2013.01)
(Continued)

(52) U.S. Cl.
CPC ............ *H01L 27/124* (2013.01); *G06F 1/163* (2013.01); *G06F 1/1637* (2013.01);
(Continued)

(58) Field of Classification Search
CPC .... G06F 3/03547; G06F 3/041; G06F 3/0412; G06F 3/0416; G06F 3/043–047;
(Continued)

(56) References Cited

U.S. PATENT DOCUMENTS

2005/0045899 A1* 3/2005 Tsutsui ................... H01L 24/83
                                                                257/99
2005/0099402 A1* 5/2005 Nakanishi ............. G06F 3/0412
                                                                345/173

(Continued)

FOREIGN PATENT DOCUMENTS

KR    10-2008-0088082 A    10/2008
KR       10-1025620 B1      3/2011
(Continued)

OTHER PUBLICATIONS

Materials Sciences and Applications, vol. 3 No. 6 (2012).

*Primary Examiner* — Nathan Danielsen
(74) *Attorney, Agent, or Firm* — Kile Park Reed & Houtteman PLLC

(57) ABSTRACT

A display device includes a display panel divided into a display region and a non-display region, the display panel including a panel pad part on the non-display region, a driving circuit substrate including a driving pad part, the driving circuit substrate to provide a driving signal to the display panel, a panel connecting substrate including a first connecting pad part and a second pad part, the panel connecting substrate to electrically connect the display panel and the driving circuit substrate, a first adhesive member between the driving pad part and the first connecting pad part, and a second adhesive member between the panel pad
(Continued)

part and the second connecting pad part. At least one of the first and second adhesive members is a conductive adhesive member including a polymer resin and a plurality of conductive particles including at least one of tin or indium.

37 Claims, 17 Drawing Sheets

(51) Int. Cl.
*G06F 1/16* (2006.01)
*G09G 3/3233* (2016.01)
*G09G 3/20* (2006.01)

(52) U.S. Cl.
CPC ........ *G06F 1/1643* (2013.01); *G06F 3/03547* (2013.01); *G09G 3/3233* (2013.01); *H01L 27/1259* (2013.01); *G09G 3/2092* (2013.01); *G09G 2300/0426* (2013.01); *G09G 2300/0842* (2013.01)

(58) Field of Classification Search
CPC ......... G09G 3/2092; G09G 3/32–3291; G09G 2300/0421; G09G 2300/0426; H01L 27/12; H01L 27/1214; H01L 27/124; H01L 27/1244; H01L 27/1259–127; H01L 2924/01049; H01L 2924/0105; H01L 23/52; H01L 23/522; H01L 23/53204; H01L 23/53209; H01L 23/5328; H01L 23/5385; H01L 23/5387
See application file for complete search history.

(56) References Cited

U.S. PATENT DOCUMENTS

| | | | |
|---|---|---|---|
| 2007/0001313 A1* | 1/2007 | Fujimoto | H01L 24/11 257/778 |
| 2007/0158826 A1* | 7/2007 | Sakakibara | B81B 7/0064 257/723 |
| 2009/0310314 A1* | 12/2009 | Shinn | G02F 1/167 361/749 |
| 2011/0134052 A1* | 6/2011 | Tsai | G06F 3/044 345/173 |
| 2011/0180939 A1* | 7/2011 | Sasaki | C08L 33/10 257/783 |
| 2012/0118480 A1* | 5/2012 | Paik | C09J 5/06 156/73.1 |
| 2016/0170509 A1* | 6/2016 | Notermans | G06F 1/163 345/173 |
| 2017/0200780 A1* | 7/2017 | Im | G09G 3/20 |

FOREIGN PATENT DOCUMENTS

| | | |
|---|---|---|
| KR | 10-1057608 B1 | 8/2011 |
| KR | 10-1157599 B1 | 6/2012 |
| KR | 10-1182714 B1 | 9/2012 |
| KR | 10-2014-0052931 A | 5/2014 |
| KR | 10-2014-0148333 A | 12/2014 |
| KR | 10-2015-0018247 A | 2/2015 |
| WO | WO 2013/021895 A1 | 2/2013 |
| WO | WO-2015182999 A1 * | 12/2015 |

\* cited by examiner

DISPLAY DEVICE AND METHOD FOR MANUFACTURING SAME

CROSS-REFERENCE TO RELATED APPLICATIONS

Korean Patent Application Nos. 10-2016-0048360, filed on Apr. 20, 2016, and 10-2016-0120946, filed on Sep. 21, 2016, in the Korean Intellectual Property Office, and entitled: "Display Device and Method for Manufacturing Same," are incorporated by reference herein in its entirety.

BACKGROUND

1. Field

Embodiments relate to a display device and a method for manufacturing the same.

2. Description of the Related Art

Electronic devices such as display devices include a plurality of circuit wirings and a plurality of electronic elements connected to the wirings, and are operated by being applied with electrical signals. In order to electrically connect the plurality of circuit wirings and electronic devices, a conductive adhesive or a conductive film is used. For example, the conductive adhesive or the conductive film is used to electrically connect a display panel of a display device and a circuit substrate or the like.

SUMMARY

Embodiments are directed to a display device including a display panel divided into a display region and a non-display region, the display panel including a panel pad part on the non-display region, a driving circuit substrate including a driving pad part, the driving circuit substrate to provide a driving signal to the display panel, a panel connecting substrate including a first connecting pad part and a second pad part, the panel connecting substrate to electrically connect the display panel and the driving circuit substrate, a first adhesive member between the driving pad part and the first connecting pad part, and a second adhesive member between the panel pad part and the second connecting pad part. At least one of the first and second adhesive members is a conductive adhesive member including a polymer resin and a plurality of conductive particles including at least one of tin or indium.

Each of the conductive particles may be at least one selected from the group consisting of a tin-silver alloy, a tin-copper alloy, a tin-silver-copper alloy, a tin-bismuth alloy, a tin-zinc alloy, a tin-indium alloy, a tin-indium-bismuth alloy and an indium-bismuth alloy.

Each of the conductive particles may be made up of a tin-bismuth alloy, the tin-bismuth alloy containing tin in an amount of 37 wt % to 47 wt % inclusive with respect to the total weight thereof, and bismuth in an amount of 53 wt % to 63 wt % inclusive with respect to the total weight thereof.

Each of the conductive particles may be made up of an indium-bismuth-tin alloy, the indium-bismuth-tin alloy containing indium in an amount of 46 wt % to 56 wt % inclusive with respect to the total weight thereof, bismuth in an amount of 27.5 wt % to 37.5 wt % inclusive with respect to the total weight thereof, tin in an amount of 11.5 wt % to 21.5 wt % inclusive with respect to the total weight thereof.

Each of the conductive particles may have a melting point of 60° C. to 200° C. inclusive.

The second adhesive member may be a conductive adhesive film including conductive metal balls or a conductive adhesive paste including conductive metal balls.

The driving pad part may include a plurality of driving pads. The first connecting pad part may include a plurality of first connecting pads. The driving pads face corresponding ones of the first connecting pads.

A connection area of the conductive particles connected to the first connecting pads may be 5% to 40% inclusive with respect to an area of one surface of the first connecting pads overlapping the driving pads.

The first adhesive member between the driving pads and the first connecting pads may have a thickness of about 1 μm to about 5 μm.

The panel pad part may include a plurality of panel pads. The second connecting pad part may include a plurality of second connecting pads. The panel pads may face corresponding ones of the second connecting pads.

A connection area of the conductive particles connected to the second connecting pads may be 5% to 40% inclusive with respect to an area of one surface of the second connecting pads overlapping the panel pads.

The second adhesive member between the panel pads and the second connecting pads may have a thickness of about 1 μm to about 5 μm inclusive.

The display panel may include an edge having a curved shape. The panel pad part may include a plurality of panel pads aligned along the edge. The second connecting pad part may include a plurality of second connecting pads facing corresponding ones of the plurality of panel pads. The second adhesive member is between the panel pads and the second connecting pads.

The second adhesive member may have a shape corresponding to the curved shape.

The display device may further include a touch sensor on the display panel, the touch sensor including a touch pad part.

The display device may further include a touch connecting substrate to electrically connect the touch sensor and the driving circuit substrate, the touch connecting substrate including a first touch connecting pad part and a second touch connecting pad part.

The display device may further include a third adhesive member between the driving pad part and the first touch connecting pad part, and a fourth adhesive member disposed between the touch pad part and the second touch connecting pad part. At least one of the third adhesive member and the fourth adhesive member is a conductive adhesive member including a polymer resin and conductive particles including at least one of tin or indium.

Each of the conductive particles may be made of at least one selected from the group consisting of a tin-silver alloy, a tin-copper alloy, a tin-silver-copper alloy, a tin-bismuth alloy, a tin-zinc alloy, a tin-indium alloy, a tin-indium-bismuth alloy and an indium-bismuth alloy.

At least one of the first and second adhesive members may further include a plurality of spacer particles.

Each of the conductive particles may be made of at least one selected from the group consisting of a tin-silver alloy, a tin-copper alloy, a tin-silver-copper alloy, a tin-bismuth alloy, a tin-zinc alloy, a tin-indium alloy, a tin-indium-bismuth alloy and an indium-bismuth alloy.

Each of the spacer particles may be a metallic particle including at least one of gold, silver, copper and palladium, or a nonmetallic particle including polymer resin or silicon oxide.

The spacer particles may have an average diameter of 1 µm to 10 µm.

The driving pad part may include a plurality of driving pads. The first connecting pad part may include a plurality of first connecting pads. The driving pads may face respective ones of the first connecting pads.

The first adhesive member may be the conductive adhesive member. A connection area of the conductive particles connected to the first connecting pads may be 1% to 40% inclusive with respect to an area of one surface of the first connecting pads overlapping the panel pads.

The panel pad part may include a plurality of panel pads. The second connecting pad part may include a plurality of second connecting pads. The panel pads may face corresponding ones of the second connecting pads.

The second adhesive member may be the conductive adhesive member. A connection area of the conductive particles connected to the second connecting pads may be 1% to 40% inclusive with respect to an area of one surface of the second connecting pads overlapping the panel pads.

The conductive adhesive member may be a conductive adhesive film, or a conductive adhesive paste.

Embodiments are also directed to a method for manufacturing a display device including providing a display panel including a panel pad part, providing a panel connecting substrate including a first connecting pad part and a second connecting pad part, providing a driving circuit substrate including a driving pad part, providing a conductive adhesive on at least one pad part of the driving pad part or the first connecting pad part, wherein the conductive adhesive includes a base resin and a plurality of conductive particles including at least one of tin or indium, aligning the driving circuit substrate and the panel connecting substrate such that the driving pad part and the first connecting pad part face each other, heating the conductive adhesive to a temperature equal to or higher than a melting point of the conductive particles, and pressing and bonding the aligned driving circuit substrate and the panel connecting substrate.

The method may further include providing the conductive adhesive on at least one pad part of the panel pad part or the second connecting pad part, aligning the display panel and the panel connecting substrate such that the panel pad part and the second connecting pad part face each other, heating the conductive adhesive to a temperature equal to or higher than the melting point of the conductive particles, and pressing and bonding the aligned display panel and the panel connecting substrate.

The method may further include providing a touch sensor including a touch pad part on the display panel providing a touch connecting substrate including a first touch connecting pad part and a second touch connecting pad part, providing the conductive adhesive on at least one pad part of the driving pad part or the first touch connecting pad part, aligning the driving circuit substrate and the touch connecting substrate such that the driving pad part and the first touch connecting pad part face each other, heating the conductive adhesive to a temperature equal to or higher than the melting point of the conductive particles, and pressing and bonding the driving circuit substrate and the touch connecting substrate.

The method may further include providing the conductive adhesive on at least one pad part of the touch pad part or the second touch connecting pad part, heating the conductive adhesive to a temperature of equal to or higher than the melting point of the conductive particles, and pressing and bonding the touch sensor and the touch connecting substrate.

The melting point of the conductive particles may be 60° C. to 200° C. inclusive.

The conductive adhesive may further include a thermoplastic polymer resin.

The conductive adhesive may have a viscosity of 100,000 cps to 700,000 cps inclusive.

Each of the conductive particles may be made of at least one selected from the group consisting of a tin-silver alloy, a tin-copper alloy, a tin-silver-copper alloy, a tin-bismuth alloy, a tin-zinc alloy, a tin-indium alloy, a tin-indium-bismuth alloy and an indium-bismuth alloy.

Each of the conductive particles may be a tin-bismuth alloy containing tin in an amount of 37 wt % to 47 wt % inclusive with respect to the total weight thereof and bismuth in an amount of 53 wt % to 63 wt % inclusive with respect to the total weight thereof.

A thermosetting temperature of the base resin may be 100° C. to 200° C. inclusive.

The weight of the conductive particles with respect to a total weight of the conductive adhesive may be 1 wt % to 30 wt % inclusive.

Providing the conductive adhesive is performed through a dispensing method, a screen printing method, a slit coating method or a dotting method.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
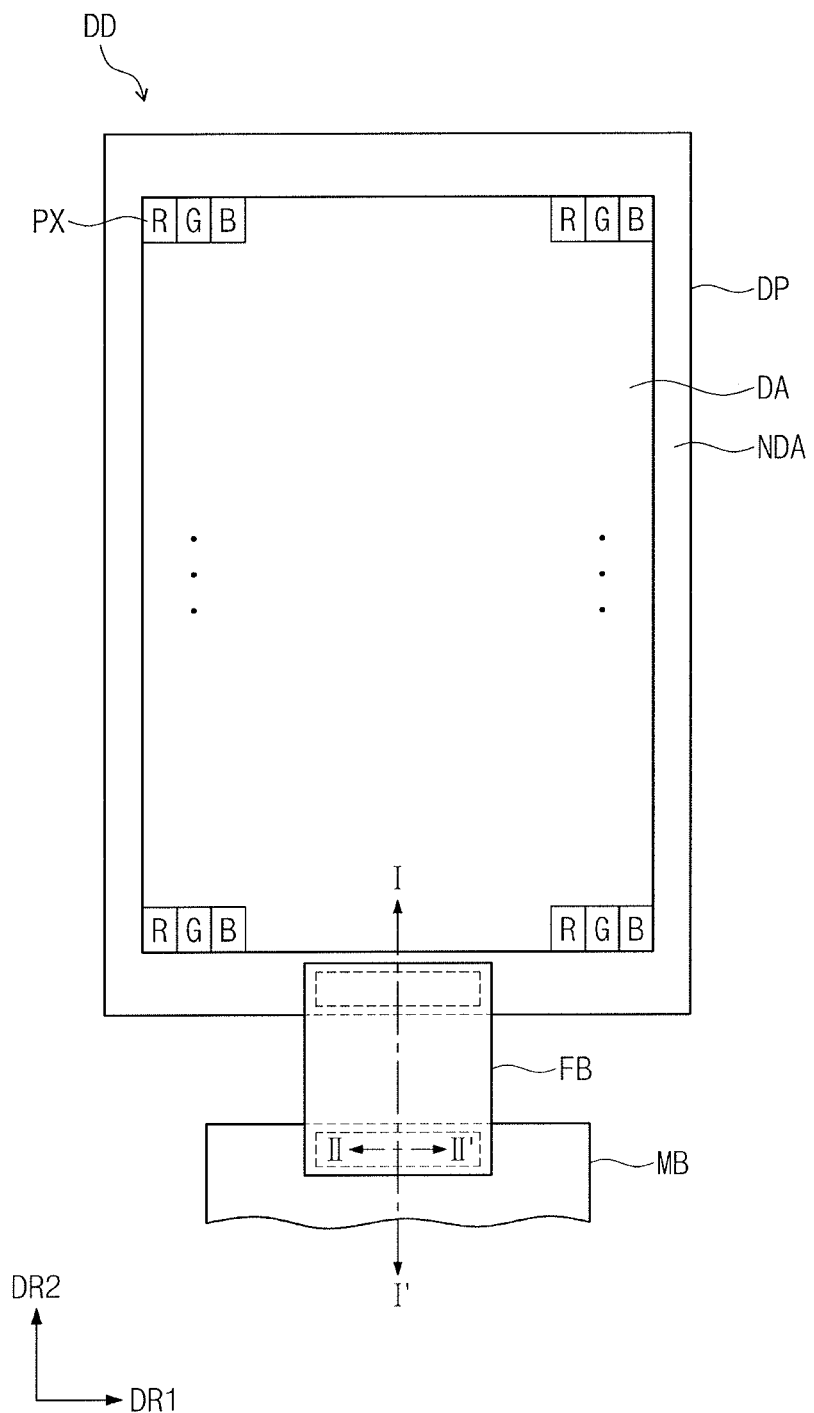
FIG. 1 illustrates a plan view of a display device according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
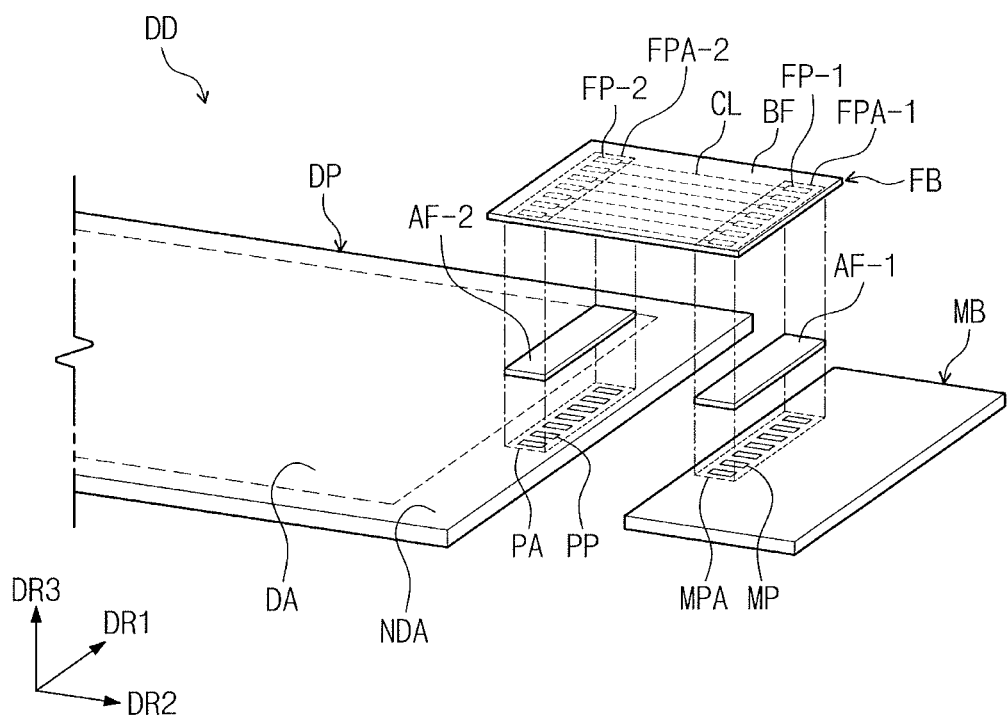
FIG. 2 illustrates an exploded perspective view of a display device according to an embodiment.
Figure 3A:
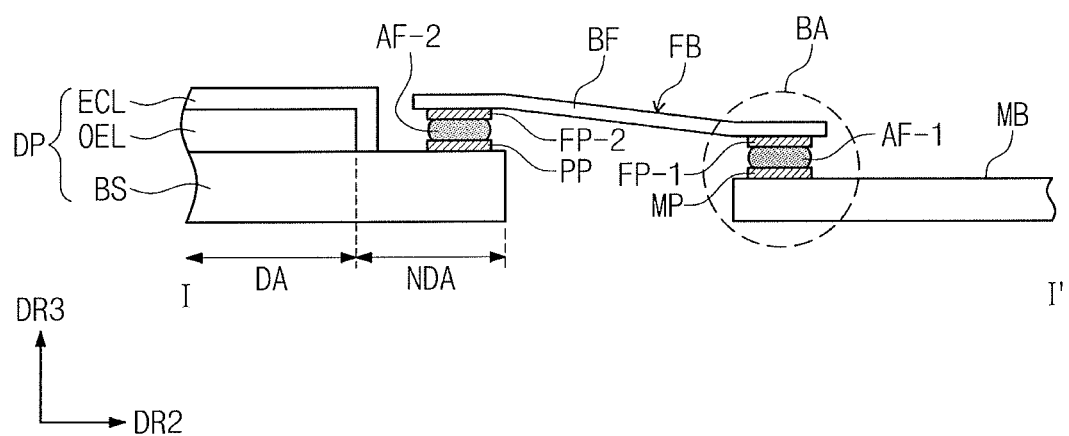
FIG. 3A illustrates a cross-sectional view of a surface corresponding to line I-I' of FIG. 1.

Hereinafter, a display apparatus according to an embodiment of the inventive concept will be described with reference to the accompanying drawings. FIG. 1 illustrates a perspective view of a display device DD according to an embodiment, and FIG. 2 illustrates an exploded perspective view of the display device DD according to an embodiment. FIG. 3A illustrates a view depicting a cross-section corresponding to line I-I' of FIG. 1.

Referring to FIGS. 1 and 2, a display device DD according to an embodiment may include a display panel DP, a panel connecting substrate FB, and a driving circuit substrate MB. In addition, the display device DD may include a first adhesive member AF-1 to couple the driving circuit substrate MB and the panel connecting substrate FB, and a second adhesive member AF-2 to couple the display panel DP and the panel connecting substrate FB.

The display panel DP may be, for example, an organic light emitting display panel, a liquid crystal display panel, a plasma display panel, an electrophoretic display panel, a microelectromechanical system (MEMS) display panel, an electrowetting display panel, or the like. Herein, an embodiment in which the display panel DP is an organic light emitting display panel is described as an example.

The display panel DP may be flexible. The term "flexible" refers to a property of being bendable, and may encompass a range of flexibility from a completely foldable structure to a structure that bendable in a several nanometer level. The display panel DP may be, for example, a curved display panel or a foldable display panel. In some implementations, the display panel DP may be rigid.

The display panel DP may be divided into a display region DA and a non-display region NDA. Referring to FIG. 1, when viewed in a plane, the display panel DP may be divided into the display region DA in which a plurality of pixels PX are disposed, and a non-display region NDA surrounding the display region DA. The non-display region NDA may include a panel pad part PA connected with the panel connecting substrate FB.

The display region DA may be a region for displaying an image. The display region DA may be a region that receives a driving signal from the driving circuit substrate MB to display an image. The non-display region NDA may be a region disposed outside and surrounding the edge of the display region DA. In some implementations, the non-display region NDA may be provided only on edges of at least one side of the display region DA.

FIGS. 1 and 2 illustrate the display panel DP as having a rectangular shape. In some implementations, the display panel DP may have a circular, elliptical, or polygonal shape. In some implementations, the display panel DP may have a curved shape only in a portion thereof.

The shape of the display panel DP may be variously provided according to the display device DD to which the display panel DP is applied. The shapes of the display region DA and the non-display region NDA may be different from each other. For example, the display region DA may be provided in a rectangular shape, but the non-display region NDA surrounding the display region DA may be provided such that an edge thereof has a curved shape. In some implementations, the display region DA may have a circular or elliptical shape, but the non-display region NDA surrounding the display region DA may have a rectangular or polygonal shape.

In FIG. 1, the display panel DP may include the plurality of pixels PX. A driving signal may be applied to the plurality of pixels PX of the display panel DP and thus, a desired image may be displayed on the display region DA. The plurality of pixels PX may be disposed in a matrix shape along a first direction DR1 and a second direction DR2, which are perpendicular to each other. In an embodiment, the pixels PX may include first to third pixels respectively displaying a red color R, a green color G and a blue color B. In some implementations, the plurality of pixels PX may further include a portion of pixels respectively displaying white, cyan and magenta. The portion in which the plurality of pixels are aligned may be defined as the display region DA of the display panel DP.

Referring to FIGS. 1 and 2, a panel pad part PA may be disposed on one side of the display panel DP. The panel pad part PA may be disposed on the non-display region NDA. The panel pad part PA may be disposed on the non-display region NDA disposed on one side of the display region DA. The panel pad part PA may include a plurality of panel pads PP. The display panel DP may receive an electrical signal from the outside or output an electrical signal to the outside through the plurality of panel pads PP on the panel pad part PA. For example, the panel pads PP may be electrically connected to the driving circuit substrate MB through the panel connecting substrate FB. The panel pads PP may include copper (Cu), silver (Ag), gold (Au) or the like. In some implementations, the panel pads PP may include aluminum (Al).

The display device DD according to an embodiment may include the driving circuit substrate MB. The driving circuit substrate MB may provide the display panel DP with image data, a control signal, a power source voltage, or the like. The driving circuit substrate MB may include active elements and passive elements. The driving circuit substrate MB may be a flexible wiring substrate or a rigid wiring substrate. The driving circuit substrate MB may be electrically connected with the display panel DP through the panel connecting substrate FB. The driving circuit substrate MB may include a driving pad part MPA. The driving pad part MPA may include a plurality of driving pads MP.

The display device DD according to an embodiment may include the panel connecting substrate FB. The panel connecting substrate FB may connect the display panel DP and the driving circuit substrate MB to each other. The panel connecting substrate FB may include a first connecting pad part FPA-1 and a second connecting pad part FPA-2. The panel connecting substrate may include a base substrate BF and a first pad part FPA-1 and a second pad part FPA-2 which are disposed on the base substrate BF. The panel connecting substrate FB may be a flexible printed circuit substrate.

The base substrate BF may be formed of a flexible material, such as polyimide. Referring to FIG. 2, the first connecting pad part FPA-1 may be disposed adjacent to the driving circuit substrate MB, and the second connecting pad part FPA-2 may be disposed adjacent to the display panel DP. The first connecting pad part FPA-1 and the second connecting pad part FPA-2 may be spaced apart from each other and may be respectively disposed on edges of the base substrate BF.

The first connecting pad part FPA-1 may include a plurality of the first connecting pads FP-1 electrically connected with the driving pads MP. The first connecting pads FP-1 may be output pads. The second connecting pad part FPA-2 may include a plurality of the second connecting pads FP-2 electrically connected to the panel pads PP. The second connecting pads FP-2 may be input pads. The first connecting pads FP-1 and the second connecting pads FPA-2 may receive or output electrical signals different from each other.

The panel connecting substrate FB may include connecting lines CL. The connecting lines CL may be disposed on the base substrate BF and may electrically connect the first and second connecting pads FP-1 and FP-2.

In the panel connecting substrate FB, the first and second connecting pads FP-1 and FP-2 and the connecting lines CL may be disposed on the same plane. In some implementations, the first and second connecting pads FP-1 and FP-2 may be respectively disposed on planes different from each other in the base substrate BF.

The first connecting pads FP-1 may be disposed on a lower surface of the base substrate BF and the second connecting pads FP-2 may be disposed on an upper surface of the base substrate BF. The connecting lines CL may be disposed on the upper or lower surface of the base substrate BF, or the connecting lines CL may be disposed on both the upper and lower surfaces through a via hole formed in the base substrate BF.

The display device DD according to an embodiment may include the first adhesive member AF-1 and the second adhesive member AF-2. The first adhesive member AF-1 may electrically connect the driving circuit substrate MB and the panel connecting substrate FB. The first adhesive member AF-1 may be disposed between the driving pad part MPA and the first connecting pad part FPA-1. The second adhesive member AF-2 may electrically connect the display panel DP and the panel connecting substrate FB. The second adhesive member AF-2 may be disposed between the panel pad PP and the second connecting pad FP-2.

In FIG. 2, the first adhesive member AF-1 and the second adhesive member AF-2 are illustrated as being separated, for convenience of illustration. In the display device DD according to an embodiment, the first adhesive member AF-1 may be disposed to be coupled to the driving pads MP and the first connecting pads FP-1 which are respectively disposed on both sides of the first adhesive member AF-1 between the driving pad part MPA and the first connecting pad part FPA-1. The second adhesive member AF-2 may be disposed to be coupled to the panel pads PP and the second connecting pads FP-2 between the panel pad part PA and the second connecting pad part FPA-2.

In FIG. 2, the first adhesive member AF-1 and the second adhesive member AF-2 are illustrated as having rectangular shapes when viewed in a plane. In some implementations, the first adhesive member AF-1 and the second adhesive member AF-2 may be provided in various shapes suitable for electrically connecting the pads facing each other with the adhesive members AF-1 and AF-2 therebetween. For example, the first adhesive member AF-1 may be disposed to surround the driving pad MP and the first connecting pad FP-1. The second adhesive member AF-2 may be disposed to surround the panel pad PP and the second connecting pad FP-2.

One surface of the first adhesive member AF-1 may contact the driving pads MP on the driving pad part MPA and may surround exposed surfaces of the driving pads MP. The other surface of the first adhesive member AF-1 may contact the first connecting pads FP-1 on the first connecting pad part FPA-1 and may surround exposed surfaces of the first connecting pads FP-1.

One surface of the second adhesive member AF-2 may contact the panel pads PP on the panel pad part PA and may surround exposed surfaces of the panel pads PP. The other surface of the second adhesive member AF-2 may contact the second connecting pads FP-2 on the second connecting pad part FPA-2 and may surround exposed surfaces of the second connecting pads FP-2.

Referring to FIG. 2, the plurality of driving pads MP included in the driving pad part MPA and the plurality of the first connecting pads FP-1 included in the first connecting pad part FPA-1 may be disposed to face each other. For example, the plurality of driving pads MP may be positioned to correspond to the first connecting pads FP-1. The driving pads MP may be aligned in the first direction DR1 to be spaced apart from each other. The first connecting pads FP-1 may be aligned in the first direction DR1 to be spaced apart from each other.

The plurality of panel pads PP included in the panel pad part PA and the plurality of the second connecting pads FP-2 included in the second connecting pad part FPA-2 may be disposed to face each other. The plurality of panel pads PP may face corresponding ones of the second connecting pads FP-2. The panel pads PP may be aligned in the first direction DR1 to be spaced apart from each other. The second connecting pads FP-2 may be aligned in the first direction DR1 to be spaced apart from each other.

Figure 3B:
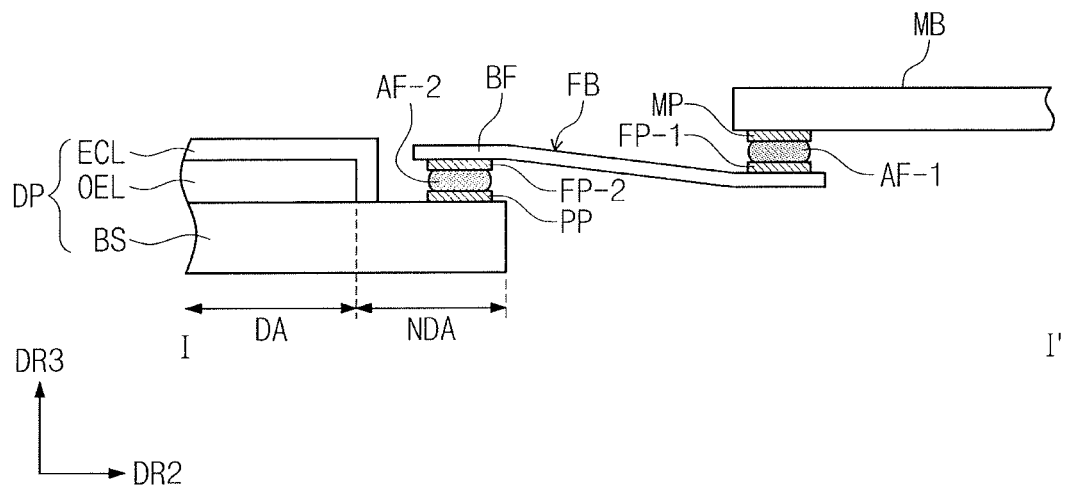
FIG. 3B illustrates a cross-sectional view of a display device according to an embodiment.

FIGS. 3A and 3B illustrate cross-sectional views of a portion of a display device according to an embodiment. FIG. 3A illustrates a cross-sectional view of a surface corresponding to line I-I' of FIG. 1.

Referring to FIGS. 2 and 3A, the first adhesive member AF-1 may couple the driving pad MP and the first connecting pad FP-1, which face each other. The second adhesive member AF-2 may couple the panel pad PP and the second connecting pad FP-2, which face each other.

Referring to cross-sectional views of FIGS. 3A and 3B, the display panel DP and the driving circuit substrate MB may be connected through the panel connecting substrate FB. Driving and control signals supplied from the driving circuit substrate MB may be transmitted as electrical signals to the display panel DP through the panel connecting substrate FB.

FIG. 3A is a cross-sectional view corresponding to line I-I' of FIG. 1, and illustrates a case in which both the first and second connecting pads FP-1 and FP-2 are on one surface of the panel connecting substrate FB. For example, both the first and second adhesive members AF-1 and AF-2 may be disposed on the one surface of the panel connecting substrate FB.

In comparison with this, FIG. 3B illustrates a case in which the first and second connecting pads FP-1 and FP-2 are on the surfaces of the panel connecting substrate FB that are different from each other. The first connecting pad FP-1 may be on one surface of the panel connecting substrate FB, and the second connecting pad FP-2 may be on the other surface facing the one surface in the panel connecting substrate FB. For example, in the panel connecting substrate FB for connecting the display panel DP and the driving circuit substrate MB, the first connecting pad FP-1 may be on the upper surface of the panel connecting substrate FB to be connected to the driving circuit substrate MB, and the second connecting pad FP-2 may be on the lower surface of the panel connecting substrate FB to be connected to the display panel DP. In some implementations, the first connecting pad FP-1 may be on the lower surface of the panel connecting substrate FB, and the second connecting pad FP-2 may be on the upper surface of the panel connecting substrate FB.

Referring to FIGS. 3A and 3B, the first connecting pad FP-1 may be disposed to face the driving pad MP with the first adhesive member AF-1 therebetween. On the cross-sections illustrated in FIGS. 3A and 3B, the first adhesive member AF-1 is illustrated to be disposed on a portion at which the first connecting pad FP-1 and the driving pad MP overlap. In some implementations, the first adhesive member AF-1 may be disposed to extend not only to a region at which the first connecting pad FP-1 and the driving pad MP overlap but also to a region aside from the overlapped region.

The second connecting member FP-2 may be disposed to face the panel pad PP with the second adhesive member AF-2 therebetween. On the cross-sections illustrated in FIGS. 3A and 3B, the second adhesive member AF-2 is illustrated to be disposed on a portion at which the second connecting pad FP-2 and the panel pad PP overlap. In some implementations, the second adhesive member AF-2 may be disposed to extend not only to a region at which the second connecting pad FP-2 and the panel pad PP overlap but also to a region aside from the overlapping region.

The display panel DP illustrated in FIGS. 3A and 3B may be an organic light emitting display panel. The display panel DP may include a base member BS, a device layer OEL, and an encapsulation layer ECL. The device layer OEL may be disposed on the base member BS, and the encapsulation layer ECL may be disposed on the base member BS and the device layer OEL to surround the device layer OEL. The display panel DP may further include an optical member disposed on the encapsulation layer ECL. The optical member may be a phase retardation plate, a polarizing plate, or the like.

The base member BS may be a glass substrate or a plastic substrate. For example, when the base member BS is a plastic substrate, the base member may include at least one of polyimide (PI), polyethyleneterephthalate (PET), polyethylenenaphthalate (PEN), polyethersulfone (PES) or a fiber reinforced plastic (FRP). At least one inorganic layer may be provided on the base member BS. For example, a silicone nitride layer or a silicone oxide layer may be provided on the base member BS.

The device layer OEL may include display elements. The device layer OEL may include organic light emitting diodes in pixels (PX in FIG. 1).

The encapsulation layer ECL may protect the device layer OEL. The encapsulation layer ECL may surround and seal the device layer OEL. The encapsulation layer ECL may be, for example, a thin film encapsulation layer. In an embodiment, the encapsulation layer ECL may be replaced with an encapsulation substrate. The encapsulation substrate may be disposed to be spaced apart from the base member BS with the device layer OEL therebetween. A sealing agent may be provided along the periphery of the encapsulation substrate and the base member BS by forming a predetermined space.

Figure 4:
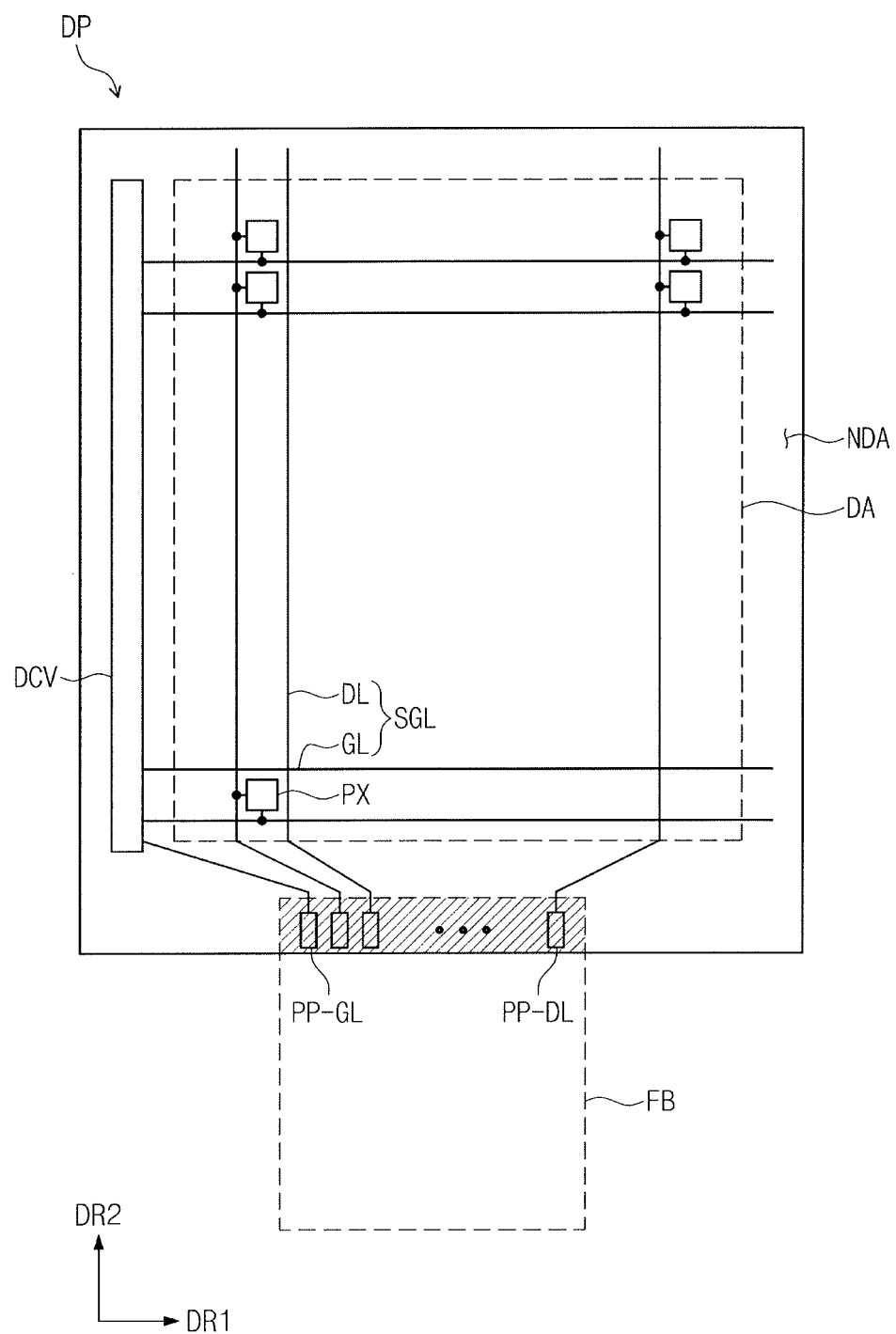
FIG. 4 illustrates a plan view of a display panel according to the embodiment of FIG. 1.
Figure 5:
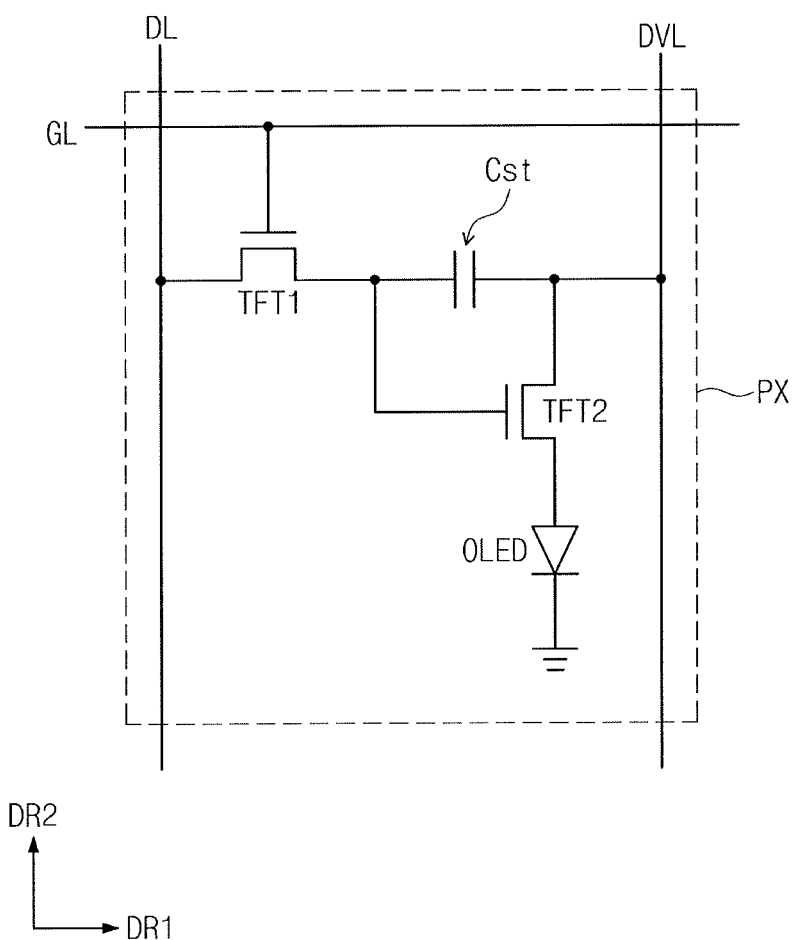
FIG. 5 illustrates an equivalent circuit diagram of a pixel in a display panel according an embodiment.

FIG. 4 illustrates a plan view of a display panel DP in which signal lines SGL are shown according to an embodiment, and FIG. 5 illustrates an equivalent circuit diagram of a pixel PX according to an embodiment. As illustrated in FIGS. 4 and 5, the device layer OEL may further include electronic devices for assisting organic light emitting devices OLED.

Referring to FIGS. 4 and 5, a display panel DP may include a plurality of signal lines SGL. The plurality of signal lines SGL may include gate lines GL aligned in a second direction DR2, and data lines DL aligned in a first direction DR1. The gate lines GL and the data lines DL may be respectively connected to pixels PX corresponding thereto from among the plurality of pixels PX.

Each of the pixels PX may include a wiring part composed of the gate line GL, the data line DL and a driving voltage line DVL, and thin film transistors TFT1 and TFT2 which are connected to the wiring part, the organic light emitting device OLED and a capacitor Cst which are connected to the thin film transistors TFT1 and TFT2.

The gate line GL may extend in the first direction DR1. The data line DL may extend in the second direction DR2 crossing the gate line GL. The driving voltage line DVL may extend in a direction substantially the same as the data lines DL, that is, in the second direction DR2. The gate line GL may transmit a scanning signal to the thin film transistors TFT1 and TFT2, the data line DL may transmit a data signal to the thin film transistors TFT1 and TFT2, and the driving voltage line DVL may provide a driving voltage to the thin film transistors TFT1 and TFT2.

The thin film transistors TFT1 and TFT2 may include a driving thin film transistor TFT2 for controlling the organic light emitting device OLED, and a switching thin film transistor TFT1 for switching the driving thin film transistor TFT2. In some implementations each of the pixels PX may include a thin film transistor and a capacitor, or each of the pixels PX may also include three or more thin film transistors and two or more capacitors.

A gate driving circuit DCV disposed on one side of a non-display region NDA may be further included. The non-display region NDA may include gate pads PP-GL and data pads PP-DL respectively connected with the gate lines GL and the data lines DL. The gate pads PP-GL and the data pads PP-DL may be connected with second connecting pads FP-2 of a panel connecting substrate FB. The panel connecting substrate FB may connect the display panel DP to the driving circuit substrate MB.

In FIGS. 2, 3A, and 3B, the first and second adhesive members AF-1 and AF-2 may be conductive adhesive members. The first and second adhesive members AF-1 and AF-2 may electrically connect pads facing each other. The first and second adhesive members AF-1 and AF-2 may have adhesive force to physically couple the pads. The first and second adhesive members AF-1 and AF-2 may couple the driving circuit substrate MB and the panel connecting substrate FB to each other, and may couple the display panel DP and the panel connecting substrate FB to each other. At least one of the first and second adhesive members AF-1 and AF-2 may be a conductive adhesive member including a polymer resin and conductive particles including at least one of tin or indium. For example, at least one of the first and second adhesive members AF-1 and AF-2 may be a conductive adhesive member including a polymer resin and conductive particles including a tin alloy. In some implementations, at least one of the first and second adhesive members AF-1 and AF-2 may be an adhesive member including a polymer resin and conductive particles including an indium alloy, or a conductive adhesive member including a polymer resin and conductive particles including an alloy of both indium and tin.

The first and second adhesive members AF-1 and AF-2 may be conductive adhesive members including a polymer resin, conductive particles, and spacer particles. The spacer particles included in the conductive adhesive member may maintain the distance between the driving pad MP on which the first adhesive member AF-1 is disposed and the first connecting pad FP-1. The spacer particles may maintain the distance between the panel pad PP on which the second adhesive member AF-2 is disposed and the second connecting pad FP-2.

Figure 6:
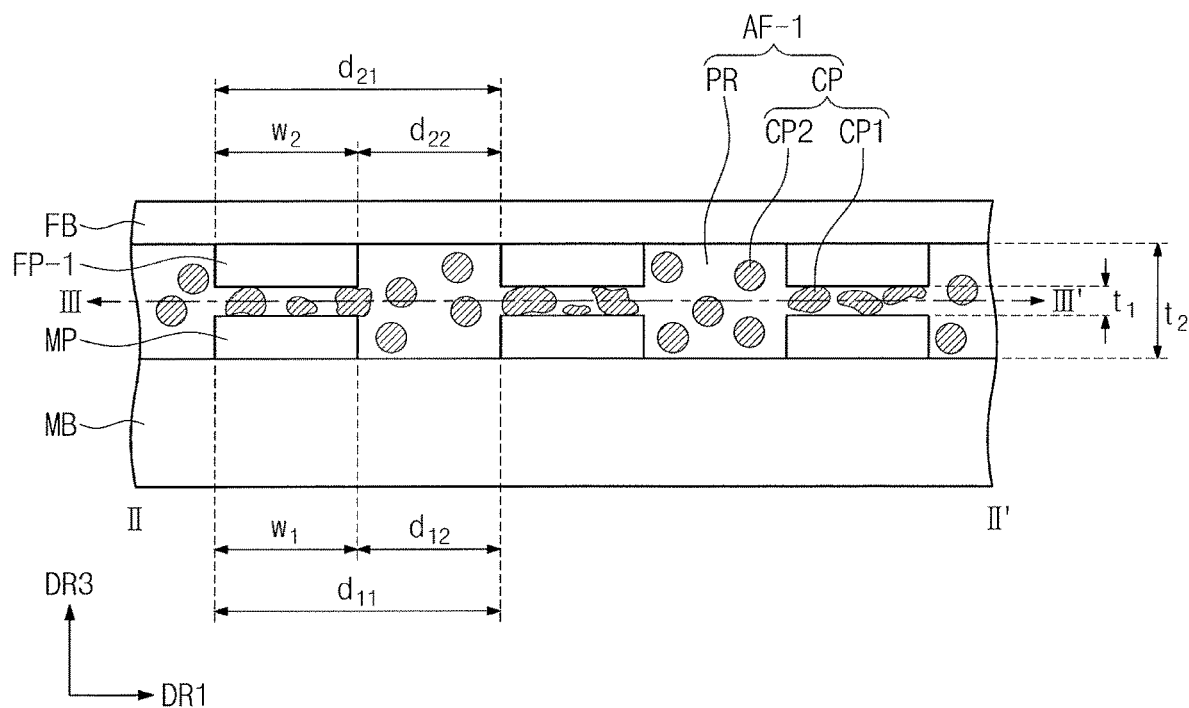
FIG. 6 illustrates a cross-sectional view of a surface corresponding to line II-II' of FIG. 2.

FIG. 6 illustrates a cross-sectional view depicting a surface corresponding to line II-II' in the display device DD illustrated in FIG. 1. FIG. 6 illustrates an enlarged view of a portion in which the panel connecting substrate FB and the driving circuit substrate MB are coupled. In the cross-sectional view of FIG. 6, the first connecting pad FP-1 of the panel connecting substrate FB and the driving pad MP of the driving circuit substrate MB may be disposed to face each other with the first adhesive member AF-1 therebetween. The first adhesive member AF-1 may be disposed to fill a space between the panel connecting substrate FB and the driving circuit substrate MB.

In the embodiment illustrated in FIG. 6, the first adhesive member AF-1 may be a conductive adhesive member including a polymer resin PR and conductive particles CP including at least one of tin or indium. The polymer resin PR may include at least one of an acryl-based resin, an epoxy-based resin or a urethane-based resin. For example, the polymer resin PR may be an acryl-based polymer resin. The conductive particles CP may be particles of an alloy including at least one of tin or indium.

The conductive adhesive member may include a polymer resin PR and conductive particles CP dispersed in the polymer resin PR. The conductive particles CP may be conductive particles of a tin alloy formed by alloying tin and at least one selected from the group consisting of silver, copper, bismuth, zinc and indium. In some implementations, the conductive particles CP may be conductive particles of an indium alloy formed by alloying indium and at least one selected from the group consisting of silver, copper, bismuth, zinc and tin. For example, the conductive particles CP may be a tin-silver alloy, a tin-copper alloy, a tin-silver-copper alloy, a tin-bismuth alloy, a tin-zinc alloy, a tin-indium alloy, a tin-indium-bismuth alloy, or an indium-bismuth alloy. For example, the first adhesive member AF-1 may include at least one of a tin-silver alloy, a tin-copper alloy, a tin-silver-copper alloy, a tin-bismuth alloy, a tin-zinc alloy, a tin-indium alloy, a tin-indium-bismuth alloy, or an indium-bismuth alloy.

The conductive particles including at least one of tin or indium may be conductive particles having a low melting point. The melting point of the conductive particles CP may vary according to kinds of and ratios of alloy materials. For example, the melting point of conductive particles including at least one of tin or indium may be about 60° C. to about 200° C.

In the display device DD, at least one of the first and second adhesive members AF-1 and AF-2 may be a conductive adhesive member further including a thermoplastic resin. For example, the thermoplastic resin may be a vinyl acetate resin, a styrene resin, an ethylene-vinyl acetate copolymer resin or a styrene-butadiene copolymer resin. In some implementations, the thermoplastic resin may be a polyester resin.

As an example, the first adhesive member AF-1 may include an acryl-based polymer resin PR and conductive particles CP of a tin-bismuth alloy dispersed in the polymer resin PR. The conductive particles of the tin-bismuth alloy may contain tin in an amount of about 37 wt % to about 47 wt % inclusive with respect to the total weight thereof, and may contain bismuth in an amount of about 53 wt % to about 63 wt % inclusive with respect to the total weight thereof. For example, tin and bismuth may be alloyed in the weight ratio of about 37:63 to about 47:53. For example, tin and bismuth may be alloyed in a weight ratio of about 42:58. The melting point of the tin alloy conductive particles CP may be about 138° C. to about 200° C. inclusive. For example, the alloy ratio of tin and bismuth is about 42:58, and the melting point may be about 138° C.

As an example, the first adhesive member AF-1 may include an acryl-based polymer resin PR and conductive particles CP of an indium-bismuth-tin alloy dispersed in the polymer resin PR. The conductive particles CP may be an alloy of indium, bismuth and tin, and may contain indium in an amount of about 46 wt % to about 56 wt % inclusive with respect to the total weight thereof, bismuth in an amount of about 27.5 wt % to about 37.5 wt % inclusive with respect to the total weight thereof, and tin in an amount of about 11.5 wt % to about 21.5 wt % inclusive with respect to the total weight thereof. For example, the conductive particles CP may include an alloy with an alloy ratio of indium:bismuth:tin of about 51:32.5:16.5. The melting point of the conductive particles CP that are alloyed in an indium:bismuth:tin ratio of about 51:32.5:16.5 may be about 60° C.

In the cross-sectional views of FIGS. 3A and 3B, the second adhesive member AF-2 may include a polymer resin and conductive particles including at least one of tin or indium which are dispersed in the polymer resin. For example, the first and second adhesive members AF-1 and AF-2 may include the same conductive adhesive member. In some implementations, the first and second adhesive members AF-1 and AF-2 may include conductive adhesive members that are different from each other. For example, the conductive particles CP included in the first and second adhesive members AF-1 and AF-2 may be different from each other.

Referring to FIG. 6, the conductive particles CP disposed between the first connecting pad FP-1 and the driving pad MP may be amorphous. The conductive particles CP disposed between the first connecting pad FP-1 and the driving pad MP may have random shapes. The conductive particles CP may not have spherical or elliptical shapes but may be amorphous. Amorphous conductive particles CP may electrically connect the first connecting pad FP-1 and the driving pad MP. The first connecting pad FP-1 and the driving pad MP may be directly electrically connected through one conductive particle CP. In some implementations, the first connecting pad FP-1 and the driving pad MP may also be indirectly electrically connected through two or more conductive particles CP. For example, two or more conductive particles CP may be disposed to contact each other and may finally electrically connect the first connecting pad FP-1 and the driving pad MP.

Referring to FIG. 6, regarding the conductive particles CP included in the first adhesive member AF-1, the shapes of the first conductive particles CP1 disposed between the first connecting pad FP-1 and the driving pad MP and the shapes of the second conductive particles CP2 disposed in the portion in which pads are not disposed may be different from each other. For example, the first conductive particles CP1 may have random shapes. The second conductive particles CP2 may have spherical or elliptical shapes.

In some implementations, the first conductive particles CP1 disposed between the first connecting pad FP-1 and the driving pad MP may have spherical or elliptical shapes. For example, the first conductive particles CP1 may have spherical or elliptical shapes having sizes different from those of the second conductive particles CP2. In some implementations, the second conductive particles CP2 may have shapes modified from spherical or elliptical shapes. For example, the second conductive particle CP2 may also have random shapes.

The conductive particles CP included in the conductive adhesive member that is disposed between the panel connecting substrate FB and the driving circuit substrate MB, may have dimensions such that sizes of first conductive particles CP1 disposed between the pad parts and sizes of second conductive particles disposed on a portion on which pad parts are not disposed may be different from each other. The first conductive particles CP1 may have a larger average particle width than the second conductive particles CP2. For example, in a method for manufacturing a display device according to an embodiment that will be described below, the conductive particles CP may be pressed and deformed in a process in which conductive particles CP included in the conductive adhesive member are melted and pressed. Accordingly, the first conductive particles CP1 may have larger sizes than the second conductive particles.

In some implementations, the conductive particles CP2 in the portion on which pads are not provided may also be melted in the manufacturing process of the display device and may have random shapes and sizes.

The average diameter of the conductive particles CP included in the first adhesive member AF-1, which is a conductive adhesive member, may be about 1 μm to about 20 μm inclusive. The average diameter of the conductive particles CP may be an average value of diameters of the unmelted conductive particles CP. The average diameter may represent an average value of maximum widths of the conductive particles CP when viewed in a cross-section.

The plurality of driving pads MP may be positioned in the first direction DR1 to be spaced apart from each other. The plurality of first connecting pads FP-1 may be positioned in the first direction DR1 to be spaced apart from each other. The pitch of the driving pads MP and the pitch of the first connecting pads FP-1 may be different from each other. Herein, the term "pitch" may refer to a disposition interval between neighboring pads and may include the pad width and the distance between neighboring pads.

The pitch of the driving pads MP may be $d_{11}$ and the pitch of the first connecting pads FP-1 may be $d_{21}$. In some implementations, $d_{11}$ and $d_{21}$ may be different from each other. In some implementations, the pitch $d_{11}$ of the driving pads MP and the pitch $d_{21}$ of the first connecting pads FP-1 may be the same. The pitch $d_{11}$ of the driving pads MP and the pitch $d_{21}$ of the first connecting pads FP-1 may be, for example, about 450 μm to about 550 μm inclusive.

The pitch $d_{11}$ of the driving pads MP may be the sum of the width $W_1$ of the driving pad MP in the first direction DR1 and the spacing distance $d_{12}$ between the driving pads MP. The pitch $d_{21}$ of the first connecting pads FP-1 may be the sum of the width $W_2$ of the first connecting pads FP-1 in the first direction DR1 and the spacing distance $d_{22}$ between the first connecting pads FP-1.

In an embodiment, the spacing distance $d_{12}$ between the driving pads MP and the spacing distance $d_{22}$ between the first connecting pads FP-1 may be the same as or different from each other. For example, the spacing distance $d_{12}$ between the driving pads MP may be about 150 μm to about 250 μm inclusive. In some implementations, the spacing distance $d_{12}$ between the first connecting pads FP-1 may be about 250 μm to about 350 μm inclusive.

The thickness t1 of the first adhesive member AF-1 between the driving pad MP and the first connecting pad FP-1 may be about 1 μm to about 5 μm inclusive. When the thickness $t_1$ is less than about 1 μm, an electrical short circuit may occur between the pads, and when the thickness $t_1$ is greater than about 5 μm, electrical connection performance between the pads may be degraded due to the conductive particles CP. The thickness $t_2$ of the first adhesive member AF-1 between the panel connecting substrate FB and the driving pad MP on which the driving pad MP and the first connecting pad FP-1 are not located may be about 20 μm to about 30 μm inclusive. The thickness $t_2$ may be equal to the distance between the panel connecting substrate FB and the driving circuit substrate MB.

Figure 7:
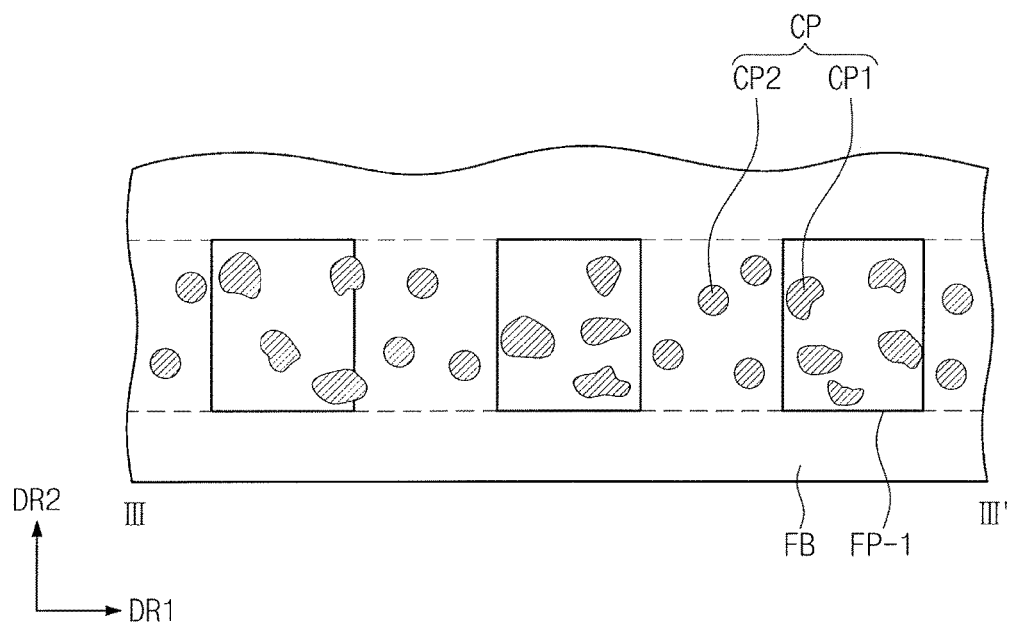
FIG. 7 illustrates a cross-sectional view of a surface corresponding to line III-III' of FIG. 6.
Figure 8:
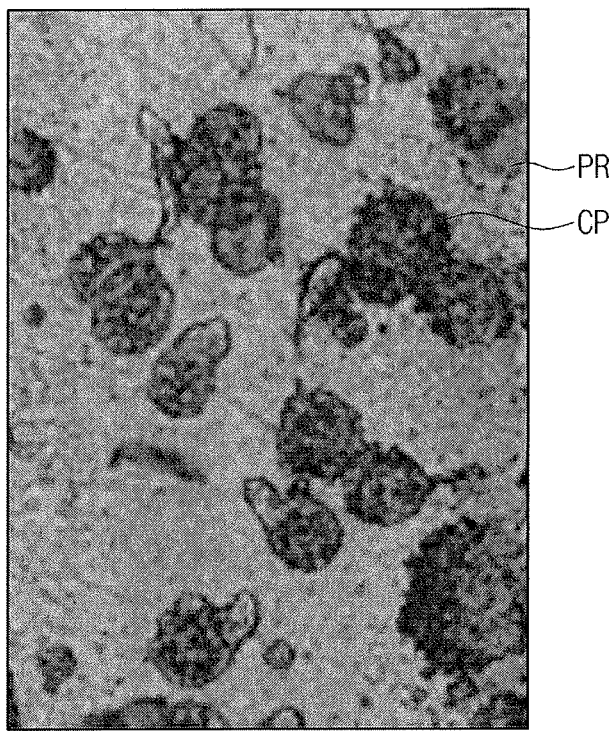
FIG. 8 illustrates an image of a portion of a cross-section corresponding to line III-III' of FIG. 6.

FIG. 7 illustrates the panel connecting substrate FB side in the cross-section corresponding to line III-III' of FIG. 6. The conductive particles CP may be disposed to be connected on the first connecting pads FP-1. For example, in an embodiment, surfaces of melted conductive particles CP may be connected on the pad surface of the first connecting pad FP-1. FIG. 8 illustrates a scanning electron microscope (SEM) photograph illustrating a portion of the cross-section corresponding to line III-III' of FIG. 6.

In FIGS. 6 to 8, the connection area of the conductive particles CP may represent a ratio of the area to which the conductive particles are connected to the total area of the pad surface of the first connecting pad FP-1 on which the conductive particles CP are disposed. The connection area of the conductive particles CP may be the relative comparison of the area of the portion of the first connecting pad FP-1 to which the conductive particles CP are connected, with respect to the area of one surface of the first connecting pads FP-1 overlapping the driving pads MP. The connection area of the conductive particles CP may be measured by an image analysis method. For example, the connection area of the conductive particles CP may be measured by comparing, in a captured image, the area of the portion on which the conductive particles DP are disposed with the total area of one surface of the first connecting pad FP-1, after capturing the image of the one surface of the first connecting pad FP-1 on which the first conductive member AF-1 is disposed. The connection area of the conductive particles CP may be about 5% to about 40% inclusive. For example, on the one surface of the first connecting pad FP-1, the surfaces of conductive particles may be connected by an area of about 5% to about 40% inclusive. For example, the connection area of the conductive particles CP may be about 5% to about 30% inclusive. For example, the connection area of the conductive particles CP may be about 5% to about 25% inclusive. In the first adhesive member AF-1 including the conductive particles CP, when the connection area of the conductive particles CP is smaller than about 5%, electrical connection may not be sufficient and a resistance value may be high. When the connection area is greater than about 40%, an electrical short circuit could occur.

In FIGS. 6 to 8, the connection relation between the first connecting pad FP-1 of the panel connecting substrate FB and the driving pad MP of the driving circuit substrate MB is illustrated. In the display device DD according to an embodiment, the above description on FIGS. 6 to 8 the connection relation may also be applied equally to the connection relation between the second connecting pad FP-2 of the panel connecting substrate FB and the panel pad PP of the display panel DP. In addition, the description on the first adhesive member AF-1 may also be applied equally to the second adhesive member AF-2.

For example, referring again to FIG. 2, the display panel DP may include the panel pad part PA. The panel pad part PA may include a plurality of panel pads PP. The panel connecting substrate FB may include the second connecting pad part FPA-2. The second connecting pad part FPA-2 may include a plurality of second connecting pads FP-2. The second adhesive member AF-2 may be disposed between the second connecting pad part FPA-2 and the panel pad part PA. The second adhesive member AF-2 may include the conductive particles (CP in FIG. 6) of a tin alloy.

The plurality of panel pads PP may be disposed to face the second connecting pads FP-2 respectively corresponding to the second connecting pads FP-2. The connection area of the conductive particles (CP in FIG. 6) connected on the second connecting pads FP-2 may be about 5% to about 40% inclusive with respect to the area of one surface of the second connecting pads FP-2 overlapping the panel pads PP. When the connection area of the conductive particles (CP in FIG. 6) is 5% or more, electrical connection may not be sufficient and a resistance value resistance value may be high. When the connection area is greater than about 40%, an electrical short circuit could occur. The connection area of the conductive particles (CP in FIG. 6) may be, for example, about 5% to about 30% inclusive. For example, the connection area of the conductive particles (CP in FIG. 6) may be about 5% to about 25% inclusive.

The thickness of the second adhesive member AF-2 disposed between the panel pads PP and the second connecting pads FP-2 may be about 1 μm to about 5 μm inclusive. The thickness of the second adhesive member AF-2 disposed between the second connecting pad part FPA-2 of the panel connecting substrate FB and the panel pad part PA may be about 20 μm to about 30 μm inclusive in a portion on which pads are not located. The second adhesive member AF-2 may be disposed to surround not only a region at which the second connecting pad FP-2 and the panel pad PP overlap but also a region aside from the overlapped region.

In an embodiment, any one of the first adhesive member AF-1 or the second adhesive member AF-2 may be a conductive adhesive film including conductive metal balls. In some implementations, any one of the first adhesive member AF-1 or the second adhesive member AF-2 may be a conductive adhesive paste including conductive metal balls. For example, in the display device DD according to an embodiment, both the first adhesive member AF-1 and the second adhesive member AF-2 may be conductive adhesive members including conductive particles CP including at least any one of tin or indium. Also, in the display device DD according to an embodiment, the first adhesive member AF-1 may be a conductive adhesive member including conductive particles CP, and the second adhesive member AF-2 may be a conductive adhesive film including the conductive metal balls. For example, the second adhesive member may be an anisotropic conductive film (ACF). In some implementations, the second adhesive member AF-2 may be a conductive adhesive paste including the conductive metal balls.

The conductive adhesive film may include the conductive metal balls. For example, the conductive adhesive film may include, as the conductive metal ball, particles of at least one metal from among nickel, cobalt, chromium or iron. In some implementations, the conductive balls may include a gold-nickel alloy or may have a core composed of a polymer resin and a shell portion composed of a metal material including nickel.

Figure 9:
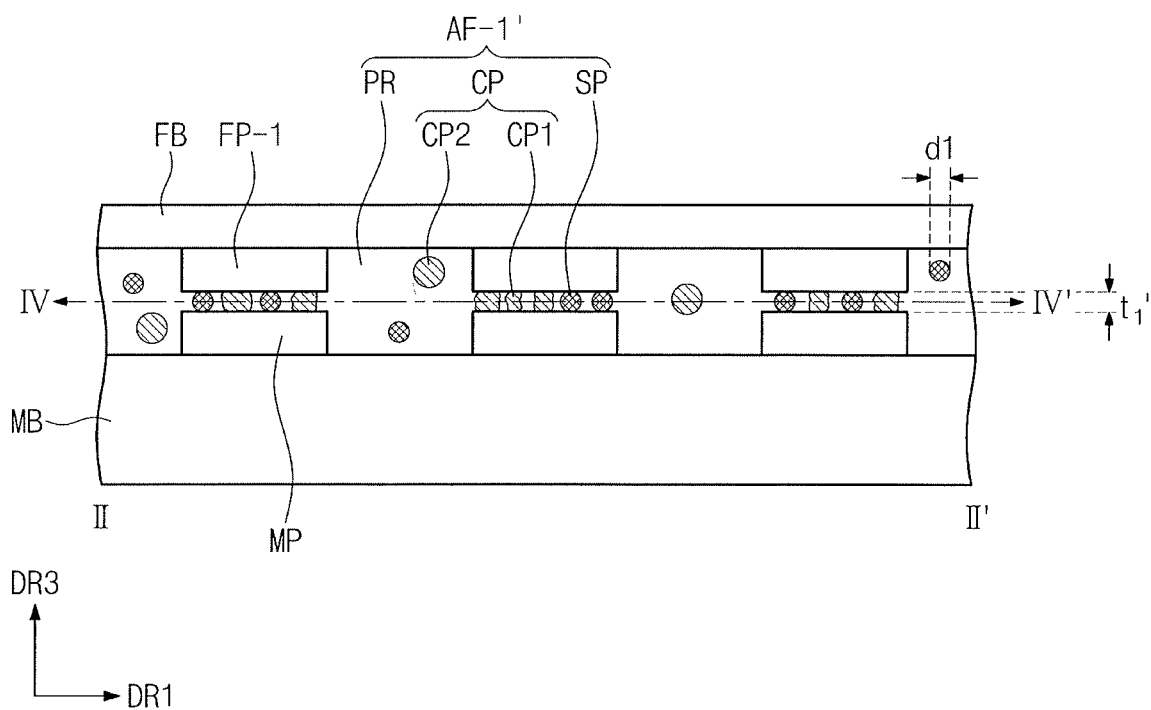
FIG. 9 illustrates a cross-sectional view of a surface corresponding to line II-II' of FIG. 2.
Figure 10:
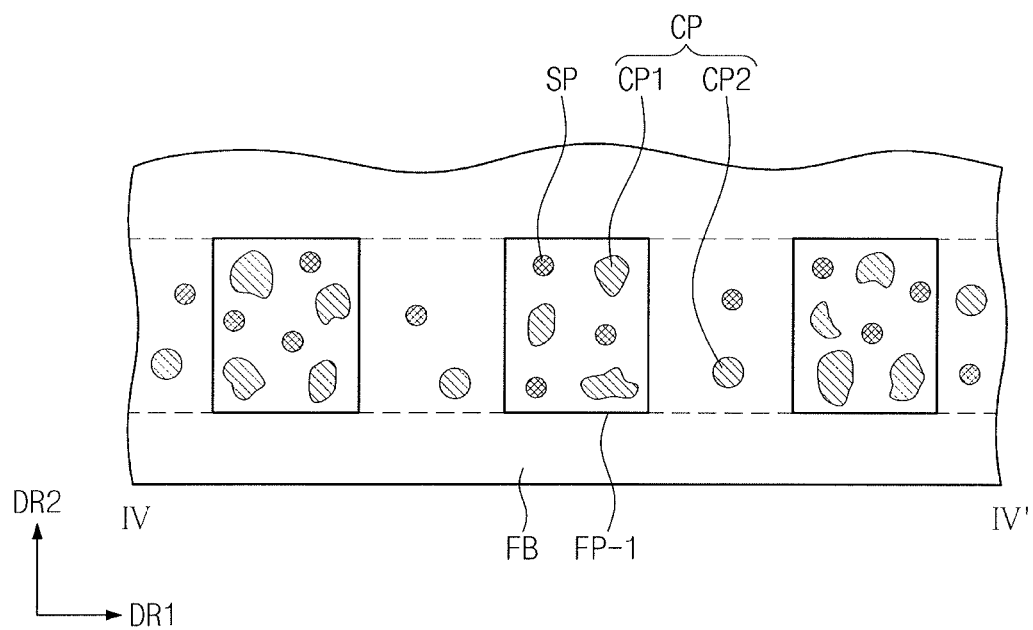
FIG. 10 illustrates a plan view of a surface corresponding to line IV-IV' of FIG. 9.

FIG. 9 illustrates a cross-sectional view illustrating a surface corresponding to line II-II' in the display device DD illustrated in FIG. 1. FIG. 10 illustrates a plan view of a surface corresponding to line IV-IV' of FIG. 9. The configuration of the first adhesive member in FIG. 9 may differ from the embodiment illustrated in FIG. 6.

FIG. 9 illustrates a connection between the panel connecting substrate FB and the driving circuit substrate MB. FIG. 9 illustrates a configuration in which first connecting pads FP-1 of the panel connection substrate FB and driving pads MP of the driving circuit substrate MB which respectively face the first connecting pads FP-1 are coupled to each other.

In FIG. 9, the plurality of driving pads MP may be positioned in a first direction DR1 to be spaced apart from each other. The plurality of first connecting pads FP-1 may be positioned in the first direction DR1 to be spaced apart from each other. The pitch of the driving pads MP and the pitch of the first connection pads FP-1 may be the same as or different from each other.

A thickness $t_1'$ of a first adhesive member AF-1' disposed between the driving pads MP and the first connecting pads FP-1 may be about 1 μm to about 5 μm inclusive. The thickness $t_1'$ may correspond to a distance between the driving pads MP and the first connecting pads FP-1.

In FIGS. 9 and 10, the first adhesive member AF-1' may include a polymer resin PR, conductive particles CP or spacer particles SP. The conductive particles CP may be particles of an alloy including at least one of tin or indium. In the embodiment illustrated in FIG. 9, in comparison with the first adhesive member AF-1 in the embodiment illustrated in FIG. 6, the first adhesive member AF-1' may further include spacer particles SP.

The conductive particles CP and the spacer particles SP may be dispersed in the polymer resin PR. The above description of the polymer resin PR and the conductive particles CP in FIG. 6 may be applied to the polymer resin PR and the conductive particles CP that are included in the first adhesive member AF-1'. For example, the polymer resin PR included in the first adhesive member AF-1' may include at least one of an acryl-based resin, an epoxy-based resin or a urethane-based resin. The conductive particles CP may be particles of an alloy including at least one of tin or indium.

The spacer particles SP may function as a supporter that maintains a distance between two facing pads. The spacer particles may function to electrically connect the two facing pads.

The spacer particles SP may be metallic particles or nonmetallic particles. The spacer particles SP may be metallic particles including at least one of gold, silver, copper, palladium or nickel. In some implementations, the spacer particles SP may be nonmetallic particles including a polymer resin or silicon oxide. In some implementations, the spacer particles SP may be combined particles, including core portions of a nonmetallic material and shell portions of a metallic materials surrounding the core portions. Here, the shell portions may include nickel metal or the like.

The spacer particles SP may be, for example, a nickel powder. In some implementations, the spacer particles SP may be silica.

The melting point of the spacer particles SP may be higher than the melting point of the conductive particles CP. Accordingly, the spacer particles SP may not be melted and may maintain their original shape at the temperature at which the conductive particles CP are melted. The melting point of the spacer particles SP may be higher than about 200° C. For example, the melting point of the spacer particles SP may be about 1,000° C. or higher. For example, the spacer particles SP including nickel may have the melting point of about 1,200° C. or higher. For example, the melting point of the spacer particles SP including nickel may be about 1,200° C. to about 1,500° C. inclusive. The melting point of the spacer particles SP including silica may be about 1,500° C. or higher. For example, the melting point of the spacer particles SP including silica may be about 1600° C.

The spacer particles SP may maintain their shape even at a temperature equal to or greater than the melting point of the conductive particles CP. Accordingly, the spacer particles may function as a supporter maintaining distances between facing pads.

However, the shapes of the spacer particles SP are not limited thereto. The spacer particles SP may be used without a limitation in shapes as long as the spacer particles SP maintain distances between two facing pads. For example, the spacer particles SP may have spherical or elliptically spherical shapes.

The spacer particles SP may have an average diameter of about 1 μm to about 10 μm inclusive. For example, the spacer particles SP may have an average diameter of about 1 μm to about 5 μm inclusive. For example, the spacer particles SP may have an average diameter of about 5 μm. When the sizes of the spacer particles SP are smaller than 1 μm, or larger than 10 μm, the spacer particles may not function as a supporter maintaining distances between facing pads.

The average diameter of the spacer particles SP may represent an average value of maximum widths of the spacer particles SP when viewed in a cross-section. In the embodiment illustrated in FIG. 9, the average diameter of the spacer particles SP may be d1. In some implementations, the average diameter d1 of the spacer particles SP may be different from the distance between the driving pads MP and the first connecting pads FP-1 which face each other.

The spacer particles SP may be electrically connected to the driving pads MP and the first connecting pads FP-1 which face each other. The spacer particles SP may each be connected at a point with each of the driving pads MP and the first connecting pads FP-1.

The conductive particles CP included in the first adhesive member AF-1' may be melted such that surfaces thereof are connected with at least one of the driving pads MP and the first connecting pads FP-1. The conductive particles CP that are melted such that surfaces thereof are finally connected with at least one of the driving pads MP and the first connecting pads FP-1 may be amorphous. The conductive particles CP that are not connected to the driving pads MP or the first connecting pads FP-1 may have spherical or elliptically spherical shapes.

The first connecting pads FP-1 and the driving pads MP may each be directly and electrically connected to each other through one conductive particle CP. In some implementations, the first connecting pads FP-1 and the driving pads MP may also be indirectly and electrically connected to each other through two or more conductive particles CP. For example, two or more conductive particles CP may be disposed to contact each other and finally, may electrically connect the first connecting pad FP-1 and the driving pad MP to each other.

When the surfaces of the conductive particles CP are connected with at least one of the driving pad MP and the first connecting pad FP-1, a connection area may represent a ratio of a connection area of the conductive particles to the total area of a pad surface of the first connecting pads FP-1 on which the conductive particles are disposed. The connection area of the conductive particles CP may represent a relative comparison of the area of the portion of the first connecting pads FP-1 to which the conductive particles CP are connected and the area of one surface of the first connecting pads FP-1 disposed to overlap the driving pads MP. The connection area of the conductive particles CP may be measured by an image analysis method. After the image of one surface of the first connecting pads FP-1 on which the first conductive member AF-1' is disposed is captured, the connection area of the conductive particles CP may be measured by comparing, in the captured image, the area of the portion on which the conductive particles CP are disposed with the total area of one surface of the first connecting pads FP-1.

In an embodiment illustrated in FIGS. 9 and 10, the connection area of the conductive particles CP may be about 1% to about 40% inclusive. For example, on one surface of the first connecting pads FP-1, the surfaces of the conductive particles CP may be connected with the one surface by an area of about 1% to about 40% inclusive. For example, the connection area of the conductive particles CP may be about 1% to about 30% inclusive. For example, the connection area of the conductive particles CP may be about 1% to about 25% inclusive. When the connection area of the conductive particles CP is smaller than about 1% in the first adhesive member AF-1' including the conductive particles CP, a high resistance value may result from insufficient electrical connection. When the connection area is greater than about 40%, an electrical short circuit could occur.

In the embodiment of FIG. 9, the connection area of the conductive particles CP included in the first adhesive member AF-1' may be smaller than that of the conductive particles CP included in the first adhesive member AF-1 in the embodiment of FIG. 6.

In the embodiment illustrated in FIG. 9, the spacer particles SP are further included in the first adhesive member AF-1', and thus, the connection area of the conductive particles CP may be smaller than the connection area in the case where the first adhesive member AF-1 of FIG. 6 is used.

In the first adhesive member AF-1' according to the embodiment illustrated in FIG. 9, gaps between the driving pads MP and the first connecting pads FP-1 may be maintained by using the spacer particles SP while surfaces of the driving pads MP and the first connecting pads FP-1 are sufficiently connected by melting the conductive particles CP. Thus, an electrical short resulting from a reduced gap between the driving pad MP and the first connecting pad FP-1 may be avoided.

In the embodiment illustrated in FIG. 9, a display device that maintains gaps between the facing pads while reducing connection resistance by using the first adhesive member AF-1', which includes both conductive particles CP and the spacer particles SP, may be provided.

In FIGS. 9 to 10, the connection relation between the first connecting pads FP-1 of the panel connecting substrate FB and the driving pads MP of the driving circuit substrate MB is illustrated and described. In the display device DD according to an embodiment, the above description with respect to FIGS. 9 to 10 may also be equally applied to the connection relation between the second connecting pads FP-2 of the panel connecting substrate FB and the panel pads PP of the display panel DP. Also, the description on the first adhesive member AF-1' may also be applied equally to the second adhesive member which is applied to the second connecting pads FP-2 of the panel connecting substrate FB and the panel pads PP of the display panel DP.

The first adhesive member AF-1' described in FIGS. 9 and 10 may be provided in a form of a conductive adhesive film. In some implementations, the first adhesive member AF-1' may be provided in a form of a conductive adhesive paste.

FIGS. 11A to 11D illustrate enlarged views of portion "BA" in FIG. 3A. FIGS. 11A to 11D illustrate enlarged cross-sectional views depicting a coupling portion of the panel connecting substrate FB and the driving circuit substrate MB. FIGS. 11A to 11D illustrate the first connecting pad FP-1, the driving pad MP and the first adhesive member AF-1 disposed between the first connecting pad FP-1 and the driving pad MP.

Figure 11A:
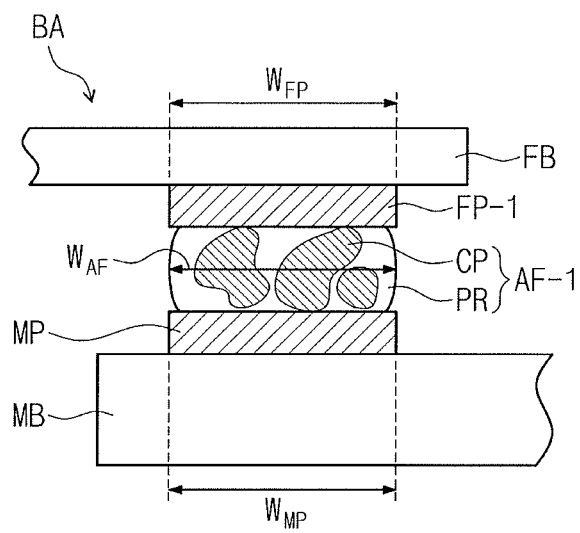
FIGS. 11A to 11D illustrate enlarged cross-sectional views of portion BA in the cross-sectional view of FIG. 3A.

In FIG. 11A, the first adhesive member AF-1 may be disposed only on the region at which the first connecting pad FP-1 and the driving pad MP overlap. The conductive particles CP may be connected with the first connecting pad FP-1 and the driving pad MP to electrically connect the first connecting pad FP-1 and the driving pad MP with each other. In some implementations, the first adhesive member AF-1 may be disposed to fill the space between the neighboring first connecting pads FP-1 on the first connecting pad part (FPA-1 in FIG. 2) on which a plurality of first connecting pads FP-1 are disposed.

Figure 11B:
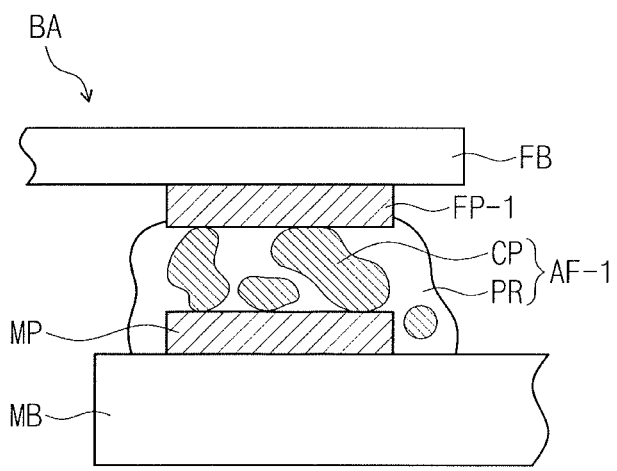
Figure 11C:
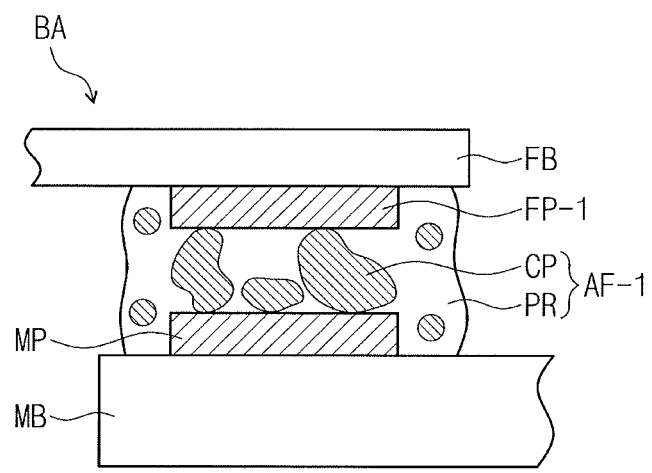

FIG. 11B illustrates the first adhesive member AF-1 being disposed to surround not only the overlapped region between the first connecting pad FP-1 and the driving pad MP but also a side surface of the driving pad MP. FIG. 11C illustrates the first adhesive member AF-1 being disposed to surround not only the overlapped region between the first connecting pad FP-1 and the driving pad MP but also all side surfaces of the driving pad MP.

Figure 11D:
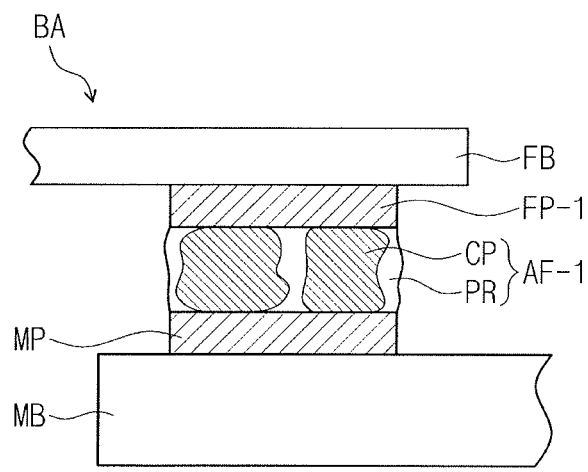

In FIG. 11D, the first adhesive member AF-1 may be disposed only on the region at which the first connecting pads FP-1 and the driving pads MP overlap. The conductive particles CP may be connected with the first connecting pads FP-1 and the driving pads MP to thereby electrically connect the first connecting pads FP-1 and the driving pads MP with each other. Referring to FIG. 11D, a conductive particle CP may have surface contact with both the first connecting pad FP-1 and the driving pad MP. The conductive particles CP that are disposed between the first connecting pads FP-1 and the driving pads MP such that the conductive particles have surface contact with each of the first connecting pads FP-1 and the driving pads MP may have widths in the horizontal direction greater than widths in the thickness direction. For example, when the conductive particles CP are melted, the widths of the conductive particles in the direction parallel to the first connecting pads FP-1 or the driving pads MP may be greater than widths in the direction perpendicular to the surfaces of the first connecting pads FP-1 or the driving pads MP.

In FIGS. 11A to 11D, the widths of the first connecting pads FP-1 and the driving pads MP may be the same as each other when viewed in a cross-section. When the first adhesive member AF-1 is disposed in the coupling shape shown in FIG. 11A, the first adhesive member AF-1 may have the same width as the widths $W_{FP}$ and $W_{MP}$ of the first connecting pad FP-1 and the driving pad MP, when viewed in a cross-section. In some implementations, the width $W_{AF}$ of the first adhesive member AF-1 may be different from the widths $W_{FP}$ and $W_{MP}$ of the first connecting pad FP-1 and the driving pad MP. For example, the width $W_{AF}$ of the first adhesive member AF-1 may be smaller than the widths $W_{FP}$ and $W_{MP}$ of the first connecting pad FP-1 and the driving pad MP.

In FIGS. 11A to 11D, the width $W_{FP}$ of the first connecting pad and the width $W_{MP}$ of the driving pad, when viewed in a cross-section, may be different from each other. The width $W_{AF}$ of the first adhesive member may be the same as any one of the width $W_{FP}$ of the first connecting pad and the width $W_{MP}$ of the driving pad. For example, the width $W_{AF}$ of the first adhesive member may be same as the smaller of the widths of the first connecting pad FP-1 or the driving pad MP. In some implementations, the width $W_{AF}$ of the first adhesive member AF-1 may be different from the width $W_{FP}$ of the first connecting pad FP-1 and the width $W_{MP}$ of the driving pad MP.

FIGS. 11A to 11D illustrate examples of a coupling shape between the first connecting pad FP-1 and the driving pad MP. The coupling shape illustrated in FIGS. 11A to 11D may also be applied between the second connecting pad FP-2 and the panel pad PP. FIGS. 11A to 11D illustrate a case in which the first adhesive member AF-1 includes a polymer resin PR and conductive particles CP as in the embodiment illustrated in FIG. 6, but in some implementations, the first adhesive member AF-1' illustrated in FIGS. 9 and 10 may be used. In some implementations, the coupling shape may be applied to the coupling of the touch connecting pad and the touch pad or to the coupling of the touch connecting pad and the driving pad, as described below.

FIGS. 12 to 14B illustrate views of a display device according to an embodiment. In the description of FIGS. 12 to 14B, description overlapping the above-mentioned description regarding display device of FIGS. 1 to 10 will not be repeated, and the difference will be mainly described.

Figure 12:
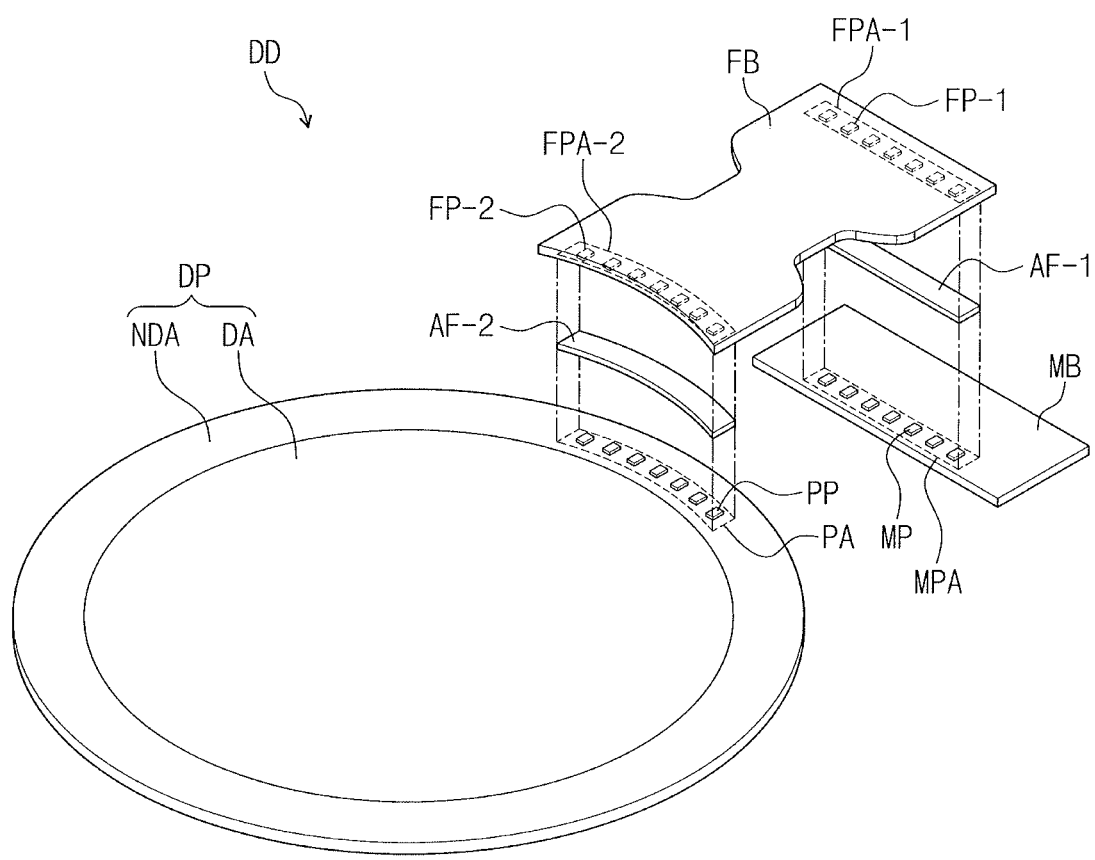
FIG. 12 illustrates an exploded perspective view of a display device according to an embodiment.

FIG. 12 illustrates an exploded perspective view of a display device according to an embodiment. The display device DD according to an embodiment may include a display panel DP, a panel connecting substrate FB, a driving circuit substrate MB, a first adhesive member AF-1 and a second adhesive member AF-2.

In an embodiment, the display panel DP may include a curved edge. The display panel DP may be divided into a display region DA and a non-display region NDA. In FIG. 12, the display panel DP is illustrated as having a circular shape. In some implementations, the display panel DP may have an elliptical shape or have a curved edge only in a portion thereof. The display panel DP may be provided in various shapes according to an electronic apparatus in which the display device DD according to an embodiment is applied. For example, the display device DD illustrated in FIG. 12 may be used in a portable electronic device such as a smart watch.

A panel pad part PA may be disposed on the non-display region NDA. A plurality of panel pads PP may be positioned on the panel pad part PA. A plurality of panel pads PP may be positioned to be spaced apart from each other and may be aligned along an edge of the display panel DP.

The panel connecting substrate FB may include a first connecting pad part FPA-1 and a second connecting pad part FPA-2. The first connecting pad part FPA-1 may be disposed adjacent to the driving circuit substrate MB. The second connecting pad part FPA-2 may be disposed adjacent to the display panel DP. The first connecting pad part FPA-1 may include a plurality of first connecting pads FP-1, and the second connecting pad part FPA-2 may include a plurality of second connecting pads FP-2.

The second connecting pads FP-2 may be spaced apart from each other. The second connecting pads FP-2 may face respective ones of the plurality of panel pads PP. For example, the second connecting pads FP-2 may be aligned along the curved shape of the edge of the display panel DP.

The second adhesive member AF-2 may be disposed between the second connecting pad part FPA-2 and the panel pad part PA. In FIG. 10, the second adhesive member AF-2 is illustrated as being separated from the second connecting pad part FPA-2 and the panel pad part PA, but in an embodiment, the second adhesive member AF-2 may be coupled to the second connecting pads FP-2 of the second connecting part FPA-2 and the panel pads PP of the panel pad part PA.

The second adhesive member AF-2 may be provided in a shape corresponding to the shapes of the second connecting pad part FPA-2 and the panel pad part PA. For example, the second adhesive member AF-2 may be provided in a shape corresponding to the curved shape of the edge of the display panel DP.

In an embodiment, the second adhesive member AF-2, which is a conductive adhesive including conductive particles (CP in FIG. 6) including at least one of tin or indium, may be provided in various shapes corresponding to the shape of the display device DD. In some implementations, the first adhesive member AF-1 disposed between the first connecting pad part FPA-1 and the driving pad part MPA may also be provided to have a curved edge.

Figure 13:
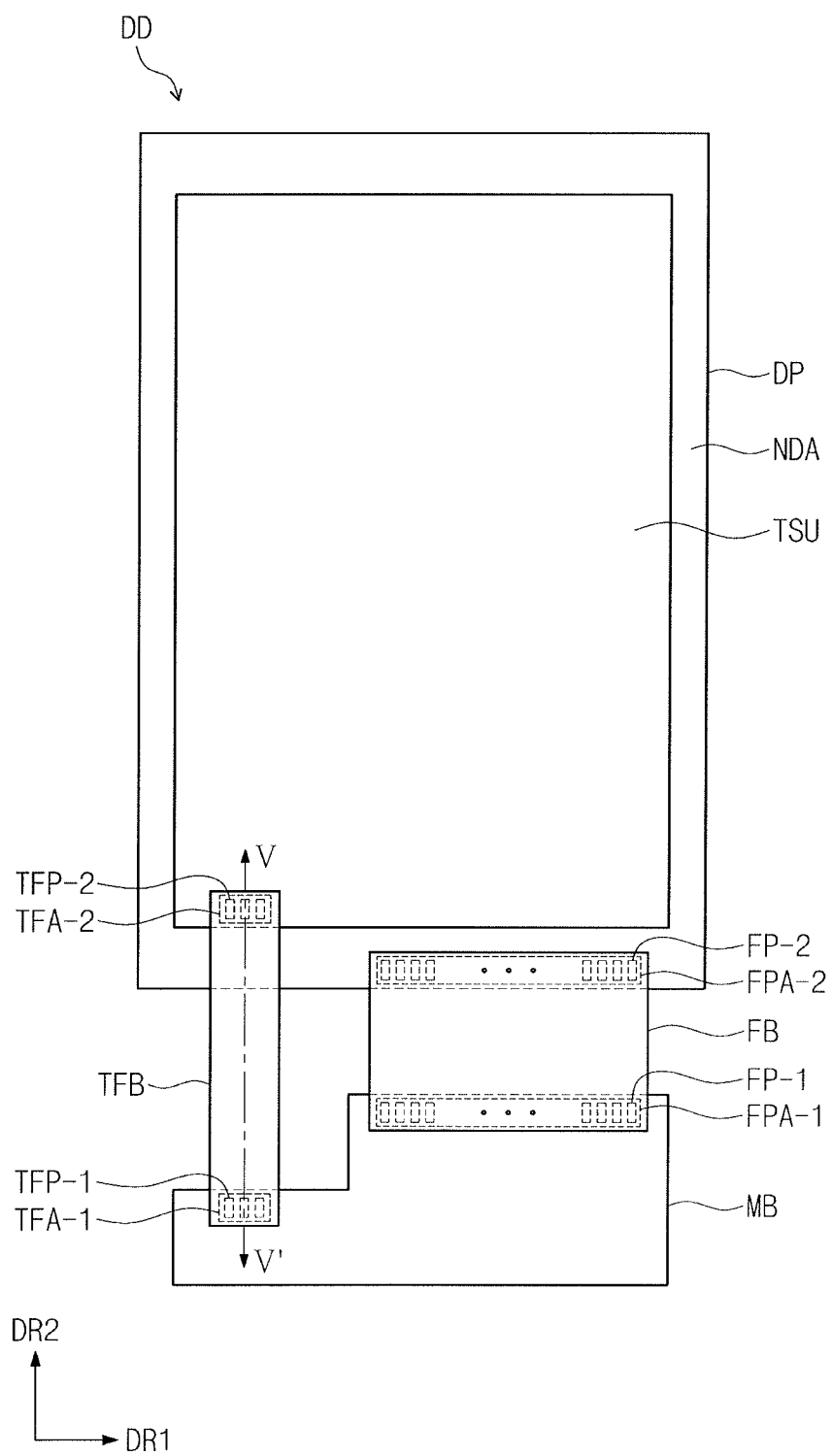
FIG. 13 illustrates a plan view of a display device according to an embodiment.
Figure 14A:
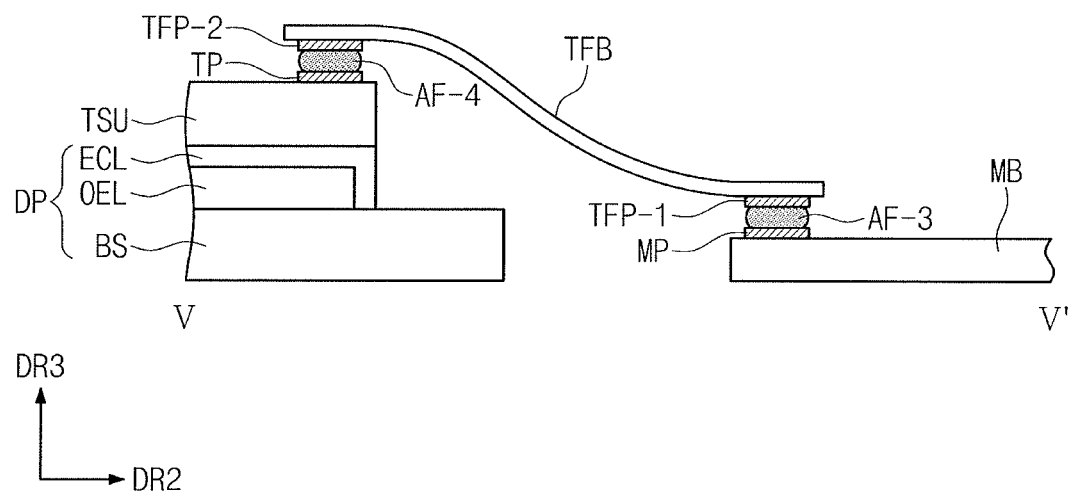
FIG. 14A illustrates a cross-sectional view of a surface corresponding to line V-V' of FIG. 13.
Figure 14B:
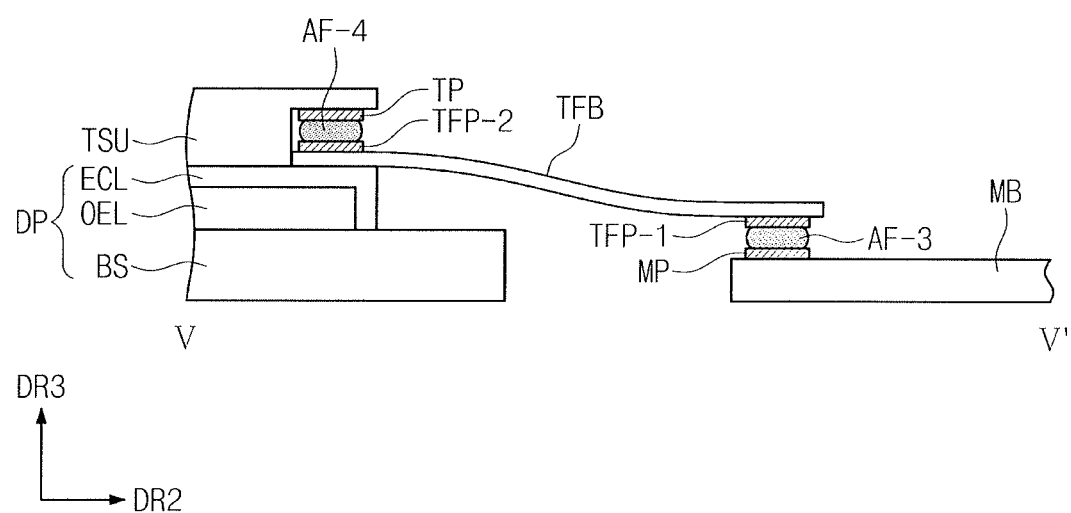
FIG. 14B illustrates a cross-sectional view of a display device according to an embodiment.

FIG. 13 illustrates a plan view of a display device DD according to an embodiment. FIGS. 14A and 14B illustrate cross-sectional views of a display device according to an embodiment. FIG. 14A illustrates a cross-sectional view corresponding to line V-V' of FIG. 13. The display device DD according to an embodiment may include a display panel DP, a touch sensor TSU, a driving circuit substrate MB, a panel connecting substrate FB and a touch connecting substrate TFB.

Referring to FIGS. 13, 14A and 14B, the display device DD may include the touch sensor TSU disposed on the display panel DP. The display device DD may include the driving circuit substrate MB providing a driving signal for driving the display panel DP and the touch sensor TSU, the panel connecting substrate FB for connecting the display panel DP and the driving circuit substrate MB, and the touch connecting substrate TFB for connecting the touch sensor TSU and the driving circuit substrate MB.

The display panel DP may include a base member BS, a device layer OEL disposed on the base member BS and an encapsulation layer ECL that surrounds the device layer OEL. The display panel DP may be an organic light emitting display panel, as an example.

The touch sensor TSU may be provided on the display panel DP. The touch sensor TSU and the display panel DP may be coupled to each other through an adhesive member provided between the touch sensor TSU and the display panel DP. In some implementations, the touch sensor TSU may be continuously provided on some components of the display panel DP, for example, on an encapsulation layer ECL without a separate adhesive member.

The touch pad part may be provided on one side of the touch sensor TSU. A plurality of touch pads TP may be disposed on the touch pad part. The touch sensor TSU may receive an electrical signal from the outside or output an electrical signal to the outside through the plurality of touch pads TP disposed on the touch pad part. For example, the panel pads PP may be electrically connected to the driving circuit substrate MB through the touch connecting substrate TFB. The touch pads TP may include copper (Cu), silver (Ag), gold (Au), or the like. In some implementations, the touch pads TP may include aluminum (Al). The driving circuit substrate MB may provide the touch sensor TSU with a control signal, a power source voltage, or the like.

In FIGS. 13 to 14A, the touch pad TP is illustrated as being located on the upper surface of the touch sensor TSU. In some implementations, the touch pad TP may be located on a lower surface of the touch sensor TSU. Referring to FIG. 14B, the touch pad TP may be located on one surface of the touch sensor TSU facing the display panel DP. In some implementations, a portion of the plurality of touch pads TP may be disposed on the upper surface of the touch sensor TSU, and the remaining portion may be disposed on the lower surface of the touch sensor TSU. The touch connecting substrate TFB may be divided into two branches at one side thereof in order to be coupled to the touch pads TP disposed on both surfaces of the touch sensor TSU. For example, the one side of the touch connecting substrate TFB on which the second touch connecting pad part TFA-2 is disposed are divided into two parts that may be respectively coupled to the touch pads disposed on the upper and lower surfaces of the touch sensor TSU.

The touch sensor TSU may include a touch substrate, and a plurality of detection electrodes provided on the touch substrate. The touch sensor TSU may detect a touch provided from the outside through the detection electrodes.

The touch sensor TSU may recognize a direct touch or an indirect touch of a user or may recognize a direct touch or an indirect touch of an object. The term "indirect touch" indicates that the touch sensor TSU recognizes a touch at a distance within which the touch sensor TSU can recognize a touch of a user or an object even when the user or the object does not directly touch the touch sensor TSU.

The touch connecting substrate TFB may connect the touch sensor TSU and the driving circuit substrate MB. The touch connecting substrate TFB may electrically connect the touch pad TP of the touch sensor TSU and the driving pad MP of the driving circuit substrate MB.

The touch connecting substrate TFB may include a first touch connecting pad part TFA-1 and a second touch connecting pad part TFA-2, which are disposed on the base wiring substrate. The touch connecting substrate TFB may be a flexible printed circuit substrate.

The base wiring substrate may be formed of a flexible material, such as polyimide. Referring to FIG. 11, the first touch connecting pad part TFP-1 may be disposed adjacent to the driving circuit substrate MB, and the second connecting pad part TFA-2 may be disposed adjacent to the touch sensor TSU. The first touch connecting pad part TFA-1 and the second connecting pad part FPA-2 may be spaced apart from each other and may be respectively disposed on edges of the base wiring substrate.

The first touch connecting pad part TFA-1 may include a plurality of the first touch connecting pads TFP-1 electrically connected with the driving pads MP. The first touch connecting pads TFP-1 may be output pads. The second touch connecting pad part TFA-2 may include a plurality of the second touch connecting pads TFP-2 electrically connected with the touch pads TP. The second touch connecting pads TFP-2 may be input pads. The first touch connecting pads TFP-1 and the second touch connecting pads TFP-2 may receive or output electrical signals different from each other.

The touch connecting substrate TFB may include connecting lines. The connecting lines may be disposed on the base wiring substrate and may electrically connect the first and second touch connecting pads TFP-1 and TFP-2.

The first and second touch connecting pads TFP-1 and TFP-2, and the connecting lines may be disposed on a same plane in the base wiring substrate. In some implementations, the first and second touch connecting pads TFP-1 and TFP-2 may be respectively disposed on planes different from each other in the base wiring substrate. For example, in an embodiment illustrated in FIG. 14A, the first and second touch connecting pads TFP-1 and TFP-2 are shown as being disposed on the same plane, and in FIG. 14B, the first and second touch connecting pads TFP-1 and TFP-2 are shown as being disposed in planes different from each other. For example, the first touch connecting pads TFP-1 may be disposed on the lower surface of the base wiring substrate, and the second touch connecting pads TFP-2 may be disposed on the upper surface of the base wiring substrate. The connecting lines may be disposed on the upper or lower surface of the base wiring substrate, or the connecting lines may be disposed on both the upper and lower surfaces through a via hole formed in the base substrate.

The display device DD according to an embodiment may include a third adhesive member AF-3 and the fourth adhesive member AF-4. The third adhesive member AF-3 may electrically connect the driving circuit substrate MB and the touch connecting substrate TFB. The third adhesive member AF-3 may be disposed between the driving pad part and the first touch connecting pad part TFA-1. The fourth adhesive member AF-4 may electrically connect the display panel DP and the touch connecting substrate TFB. The fourth adhesive member AF-4 may be disposed between the touch pad part and the second touch connecting pad part TFA-2.

At least one of the third or fourth adhesive members AF-3 or AF-4 may be a conductive adhesive member including conductive particles including at least one of tin or indium. In some implementations, at least one of the third adhesive member AF-3 or the fourth adhesive member AF-4 may be a conductive adhesive member including conductive particles including at least one of tin or indium and spacer particles. The third and fourth adhesive members AF-3 and AF-4 may be described the same as the conductive adhesive member of the above-mentioned first and second adhesive members AF-1 and AF-2.

For example, at least one of the third and fourth adhesive members AF-3 and AF-4 may be a conductive adhesive member including a polymer resin and conductive particles dispersed in the polymer resin. The conductive particles may include at leas one of tin or indium. The conductive particles may be a tin-silver alloy, a tin-copper alloy, a tin-silver-copper alloy, a tin-bismuth alloy, a tin-zinc alloy, a tin-indium alloy, a tin-indium-bismuth alloy, or an indium-bismuth alloy. For example, at least one of the third or fourth adhesive members AF-3 or AF-4 may include an acryl-based polymer resin and conductive particles including tin or indium, the particles being dispersed in the acryl-based polymer resin.

The melting point of the conductive particles may vary according to materials included in the conductive particles and an alloy ratio. The melting point of conductive particles including at least one of tin or indium may be about 60° C. to about 200° C. inclusive. For example, the melting point of the tin alloy conductive particles may be about 138° C. to about 200° C. inclusive. For example, when the alloy ratio of tin and bismuth is about 42:58, the melting point may be about 138° C.

The melting point of the indium-bismuth-tin alloy conductive particles may be about 60° C. to about 200° C. inclusive. For example, when the alloy ratio of indium-bismuth-tin is about 51:32.5:16.5, the melting point may be about 60° C.

In the display device according to an embodiment, the electrical connection property may be improved by using the conductive adhesive member including the conductive particles of a tin alloy for the electrical connection between the panel connecting substrate and the driving circuit substrate or between the panel connecting substrate and the display panel. Surfaces of the conductive particles may be connected between the connecting pad and the driving pad or between the connecting pad and the panel pad to decrease a resistance value.

The surfaces of the conductive particles may be disposed to be connected between the pads. Thus, the adhesive force between the pads may be improved. By increasing the connection area of the conductive particles with respect to the pad surfaces, the adhesion maintaining force between pads facing each other under a reliability condition may be improved.

Also, at least one of the third and fourth adhesive members AF-3 and AF-4 may be a conductive adhesive member including a polymer resin, conductive particles dispersed in the polymer resin, and spacer particles dispersed in the polymer resin. The conductive particles may be alloys including at least one of tin or indium. The conductive particles may be a tin-silver alloy, a tin-copper alloy, a tin-silver-copper alloy, a tin-bismuth alloy, a tin-zinc alloy, a tin-indium alloy, a tin-indium-bismuth alloy, or an indium-bismuth alloy. The spacer particles may be metallic particles or nonmetallic particles. At least one of the third or fourth adhesive members AF-3 or AF-4 may include an acryl-based polymer resin, conductive particles of alloys including tin or indium, the conductive particles being dispersed in the acryl-based polymer resin, and the spacer particles including nickel or silica.

The melting point of the conductive particles may vary according to materials included in the conductive particles and an alloy ratio. The melting point of conductive particles including at least one of tin or indium may be about 60° C. to about 200° C. inclusive. For example, the melting point of the tin alloy conductive particles may be about 138° C. to about 200° C. inclusive. For example, when the alloy ratio of tin to bismuth is about 42:58, the melting point may be about 138° C.

Also, the melting point of the indium-bismuth-tin alloy conductive particles may be about 60° C. to about 200° C. inclusive. For example, when the alloy ratio of indium-bismuth-tin is about 51:32.5:16.5, the melting point may be about 60° C.

In the display device according to an embodiment, the electrical connection characteristics may be improved by using the conductive adhesive member including the conductive particles of a tin alloy and the spacer particles for the electrical connection between the panel connecting substrate and the driving circuit substrate or between the panel connecting substrate and the display panel. The conductive particles may provide surface contact between the connecting pad and the driving pad or between the connecting pad and the panel pad to thereby reduce a resistance value. The spacer particles may function as a supporter between the connecting pad and the driving pad or between the connecting pad and the panel pad to thereby maintain a gap. The conductive particles may be disposed such that surfaces thereof are connected with the pads to thereby improve the adhesive force between the pads. Connection areas of the conductive particles with respect to pad surfaces may be increased, and gaps between the pads may be maintained by the spacer particles. Thus, reliability of maintaining adhesion between facing pads and electrical reliability may be improved.

Figure 15:
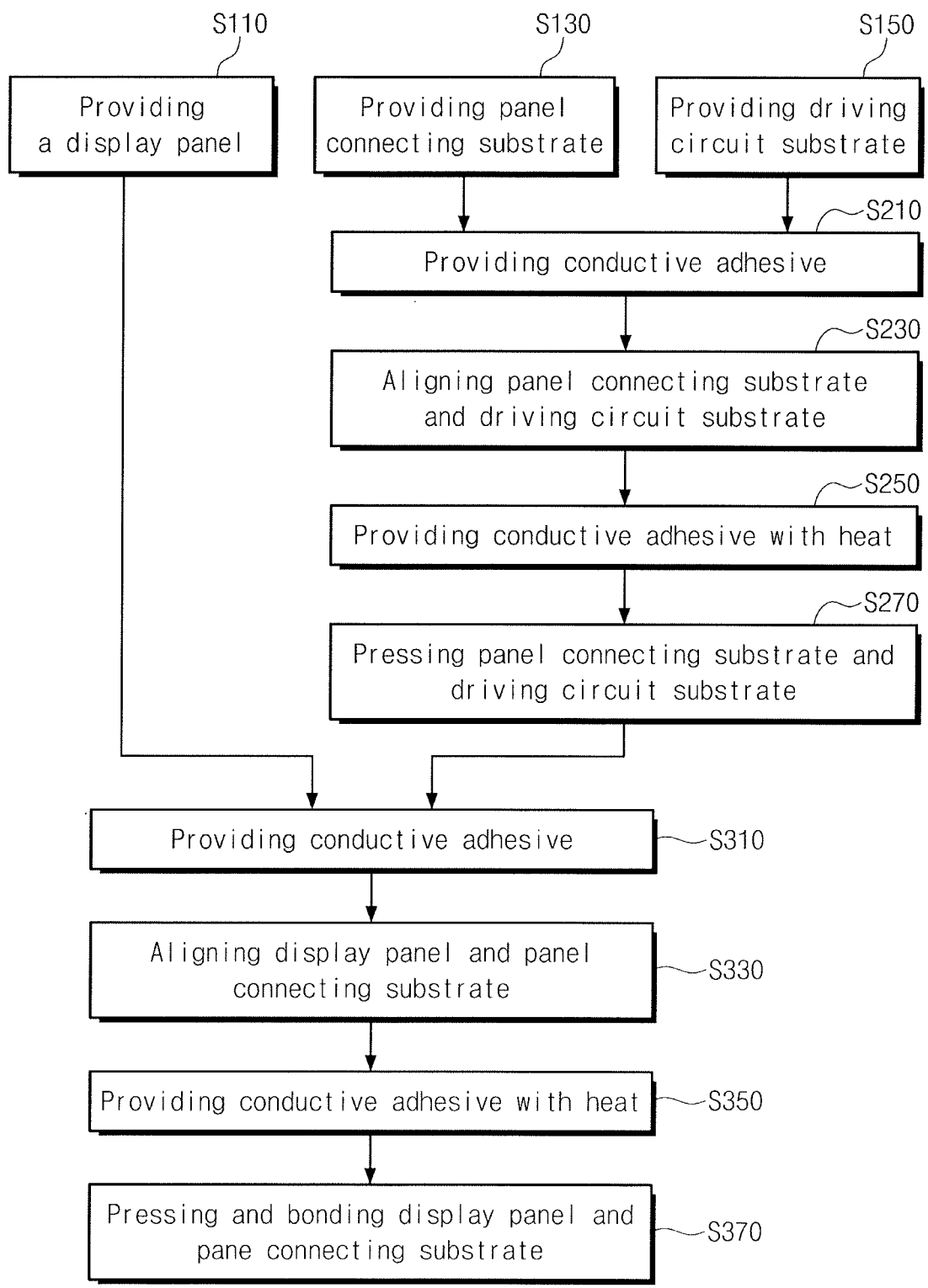
FIG. 15 illustrates a flowchart illustrating a method for manufacturing a display device according to an embodiment.
Figure 16A:
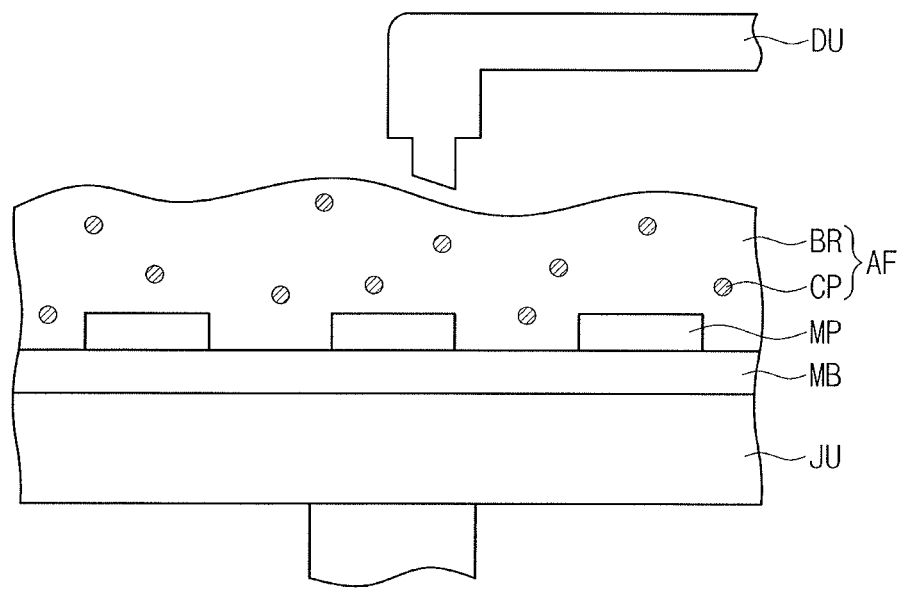
FIGS. 16A to 16C illustrate schematic views illustrating a method for manufacturing a display device according to an embodiment.
Figure 16B:
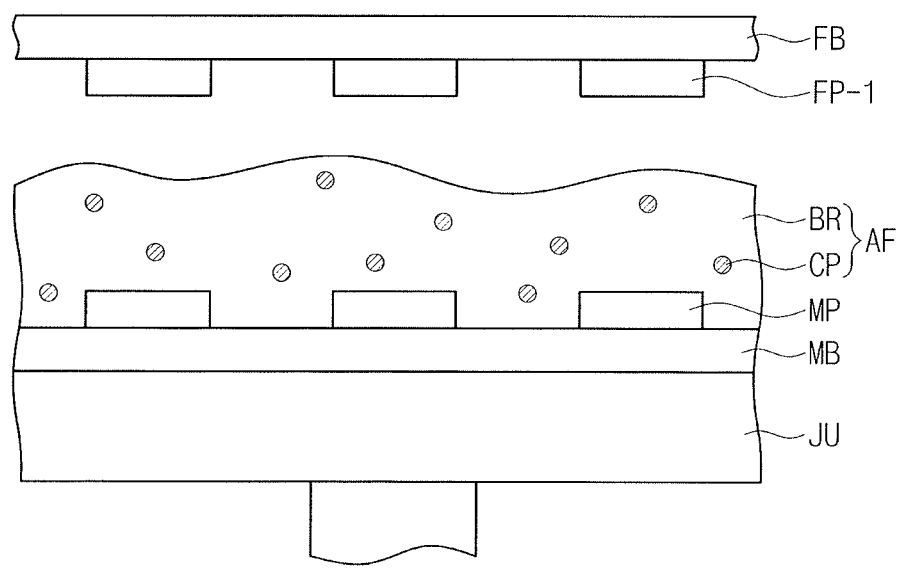
Figure 16C:
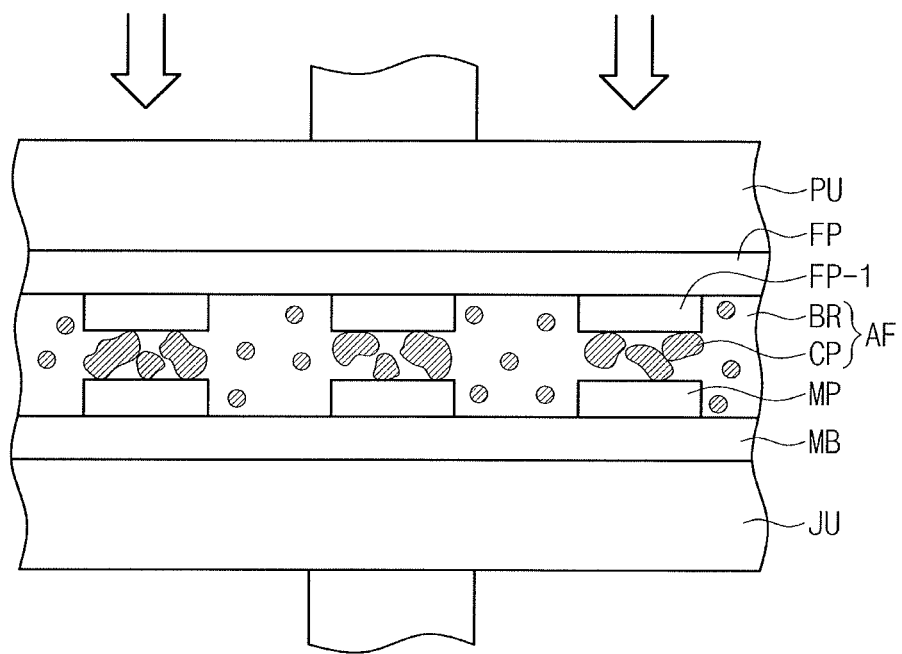

An embodiment provides a method for manufacturing a display device. FIG. 15 illustrates a flowchart depicting a method for manufacturing a display device according to an embodiment. FIGS. 16A to 16C illustrate schematic views of a method for manufacturing a display device according to an embodiment. Hereinafter, in describing the method for manufacturing a display device according to an embodiment, description overlapping the above-mentioned description about the display device according to an embodiment will not be repeated, and the differences will be mainly described.

Referring to FIG. 15, a method of manufacturing the display device according to an embodiment may include providing a display panel (S110), providing a panel connecting substrate (S130), and providing a driving circuit substrate (S150). In addition, the method for manufacturing the display device according to an embodiment may include providing a conductive adhesive (S210), aligning the panel connecting substrate and the driving circuit substrate (S230), providing heat to the conductive adhesive (S250), and pressing and bonding the panel connecting circuit substrate and the driving circuit substrate (S270).

Providing the display panel (S110) may include providing the display panel including the panel pad part. The panel connecting substrate provided in an embodiment may include a first connecting pad part and a second connecting pad part. The driving circuit substrate may include a driving pad part.

Providing a conductive adhesive (S210) may include providing the conductive adhesive between the provided driving circuit substrate and the panel connecting substrate. The conductive adhesive may be provided on the driving pad part of the driving circuit substrate or on the connecting pad part of the connecting circuit substrate. In the method for manufacturing the display device according to an embodiment, the conductive adhesive may be provided on at least one pad part of the driving pad part of the driving circuit substrate and the connecting pad part of the connecting circuit substrate.

The conductive adhesive may be provided in a form of a paste. For example, the conductive adhesive may be an anisotropic conductive paste (ACP) or an anisotropic conductive adhesive (ACA) including conductive particles including at least one of tin or indium. In some implementations, the conductive adhesive may be provided in a form of an anisotropic conductive film (ACF).

In some implementations, the conductive adhesive may include conductive particles including at least one of tin or indium and spacer particles. The conductive adhesive including both conductive particles and spacer particles may be an anisotropic conductive paste (ACP) or an anisotropic conductive film (ACF) provided in a film shape.

When the conductive adhesive is provided in a film shape, in providing the conductive adhesive (S210 and S310), the film-shaped conductive adhesive may be disposed between the panel connecting substrate and the driving circuit substrate or between the display panel and the panel connecting substrate. FIG. 16A illustrates providing the conductive adhesive (S210). In FIG. 16A, the conductive adhesive AF may be provided on the driving circuit substrate MB. The conductive adhesive AF may be provided by a dispensing method through a supply unit DU. In some implementations, the conductive adhesive may be provided through a coating method or a dotting method. Providing the conductive adhesive (S210) may be performed through a dispensing method, a screen printing method, a slit coating method or a dotting method.

FIG. 16A exemplarily illustrates the case in which the conductive adhesive AF is provided on the driving circuit substrate MB. In some implementations, the conductive adhesive AF provided between the driving circuit substrate MB and the panel connecting substrate (FB in FIG. 16B) may be provided on the connecting pad part of the panel connecting substrate FB. In some implementations, the conductive adhesive may be provided both on the driving pad part of the driving circuit substrate MB and on the connecting pad part of the panel connecting substrate FB.

The provided conductive adhesive AF may include a base resin BR and conductive particles CP of an alloy. The base resin BR may be a thermosetting resin. For example, the base resin BR may be an acryl-based resin, an epoxy-based resin, or a urethane-based resin. The conductive particle CP may be conductive particles of a tin alloy or conductive particles of an indium alloy.

The conductive adhesive AF may further include a thermal initiator and a cross-linker. The conductive adhesive AF may further a thermoplastic resin. The conductive adhesive AF may further an additional additive. For example, the added additive may be silica. The added silica may improve the strength of the conductive adhesive AF.

The conductive adhesive AF may include an acryl-based resin having a polymerizing reaction group as the base resin BR. The acryl-based resin may include an acryl monomer or an acryl oligomer. For example, the acryl-based resin may be methacrylate, urethane acrylate, epoxy acrylate or the like. The base resin BR after a polymerizing reaction may correspond to a polymer resin (PR in FIG. 6).

The conductive adhesive AF may further include a thermoplastic resin. For example, the thermoplastic resin may be a vinyl acetate resin, a styrene resin, an ethylene-vinyl acetate copolymer resin or a styrene-butadiene copolymer resin. For example, the thermoplastic resin may be a polyester-based resin. The added thermoplastic resin may increase the ductility of the conductive adhesive AF. For example, when the conductive adhesive AF further includes a thermoplastic resin, the conductive adhesive may be easily attached to or detached from the finally manufactured display device. Accordingly, when the conductive adhesive AF further includes a thermoplastic resin, the re-workability of the finally manufactured display device may be improved.

For example, the conductive adhesive AF may include an acryl-based resin, conductive particles of a tin-bismuth alloy, and a polyester-based thermoplastic resin. The conductive adhesive AF may include a thermal initiator, a curing agent, and silica.

The thermosetting temperature of the conductive adhesive AF may be about 100° C. to about 200° C. inclusive. For example, the thermosetting temperature of the base resin BR of the conductive adhesive AF may be about 100° C. to about 200° C. inclusive. For example, the thermosetting temperature of the base resin BR may be about 150° C. to about 170° C. inclusive.

The conductive particles CP may be conductive particles of a tin alloy, conductive particles of an indium alloy or an alloy including both tin and indium. The conductive particles CP may be conductive particles of a tin alloy formed by alloying tin and at least one selected from the group consisting of silver, copper, bismuth, zinc, and indium. The conductive particles CP may be conductive particles of an indium alloy formed by alloying indium and at least one selected from the group consisting of silver, copper, bismuth, zinc, and tin. For example, the conductive particles CP may be a tin-silver alloy, a tin-copper alloy, a tin-silver-copper alloy, a tin-bismuth alloy, a tin-zinc alloy, a tin-indium alloy, a tin-indium-bismuth alloy, or an indium-bismuth alloy.

The conductive particles CP may have an average diameter of about 1 μm to about 20 μm inclusive. The conductive particles CP may be provided to be dispersed in the base resin BR. For example, the conductive particles CP before being heated to be melted may have spherical or elliptical shapes.

The conductive adhesive AF may contain the conductive particles CP in an amount of about 1 wt % to about 30 wt % with respect to the total weight thereof. When the content of the conductive particles CP is smaller than about 1 wt %, the electrical connection between the pads may not be sufficient. Also, when the content of the conductive particles CP is greater than about 30 wt %, an electrical short circuit could occur due to an excessive amount of conductive particles.

For example, in an embodiment, the conductive adhesive AF may include an acryl-based resin and conductive particles of a tin-bismuth alloy. The conductive particles of a tin-bismuth alloy may contain tin in an amount of about 37 wt % to about 47 wt % inclusive with respect to the total weight thereof, and may contain bismuth in an amount of about 53 wt % to about 63 wt % inclusive with respect to the total weight thereof. For example, the alloy ratio of tin and bismuth may be about 37:63 to about 47:53. For example, the conductive particles CP of a tin alloy may contain about 42:58 weight ratio of tin to bismuth.

Also, in an embodiment, the conductive adhesive AF may include an acryl-based resin and conductive particles of an indium-tin-bismuth alloy. The conductive particles of an indium-tin-bismuth alloy may contain about 46 wt % to about 56 wt % inclusive of indium with respect to the total weight thereof, about 27.5 wt % to about 37.5 wt % inclusive of bismuth with respect to the total weight thereof, and about 11.5 wt % to about 21.5 wt % inclusive of tin with respect to the total weight thereof. For example, the conductive particles of an indium-tin-bismuth alloy may contain indium, bismuth, and tin with a weight ratio of about 51:32.5:16.5.

In FIG. 16A, the conductive adhesive AF may be applied to surround the driving pads MP. The conductive adhesive AF provided in a liquid phase may be applied in a free shape. For example, the conductive adhesive AF may be applied only between the pads facing each other. For example, the conductive adhesive may not be applied in a space between the pads which are disposed to be spaced apart from each other, but may be applied only between the pads facing each other. Also, as in FIG. 12, the conductive adhesive AF may be provided according to a shape of the panel pad part PA when manufacturing a display device having an edge with a curved surface.

For example, the conductive adhesive AF may be provided in a form of a paste shape having a shape corresponding to the shape of a portion to be applied therewith. Also, the conductive adhesive AF may be provided in the form of a liquid phase or a paste such that the providing amount may thereby be freely adjusted.

The provided conductive adhesive AF may have the viscosity of about 100,000 cps to about 700,000 cps inclusive. When the viscosity of provided conductive adhesive is less than about 100,000 cps, the conductive adhesive may flow outside the portion to be provided with the conductive adhesive. When the viscosity of provided conductive adhesive is greater than about 700,000 cps, there may be a limitation in providing the conductive adhesive AF through a dispenser. For example, the viscosity of the conductive adhesive AF may be about 100,000 cps to about 500.000 cps inclusive. For example, the viscosity of the conductive adhesive AF may be about 250,000 cps.

The melting point of the conductive particles CP in the provided conductive adhesive AF may be about 60° C. to about 200° C. inclusive. For example, the melting point of the conductive particles CP may be about 138° C. to about 200° C. inclusive, or, for example, the melting point of the conductive particles CP may be about 138° C. to about 150° C. inclusive. The melting point of the conductive particles CP may vary according to the kinds and the alloy ratio of alloy materials. For example, the melting point of the conductive particles CP of a tin-bismuth alloy may be about 138° C. to about 200° C. inclusive. For example, the melting point of the conductive particles CP which are alloyed in a tin to bismuth ratio of about 42:58 may be about 138° C.

Referring to FIGS. 15 and 16B, after providing the conductive adhesive AF, aligning the driving circuit substrate MB and the panel connecting substrate FB (S230) may be included. The driving circuit substrate MB and the panel connecting substrate FB may be aligned such that the driving pad part of the driving circuit substrate MB and the first connecting pad part of the panel connecting substrate FB are disposed to face each other. Referring to FIG. 16B, the first connecting pads FP-1 may be disposed so as to be aligned on the conductive adhesive AF provided on the driving pads MP.

Referring to FIG. 15, an embodiment may include providing heat to the conductive adhesive (S250). Providing heat to the conductive adhesive (S250) may be providing heat to a temperature of the melting point of the conductive particles or higher. For example, providing heat to the conductive adhesive (S250) may be performed at a temperature of about 60° C. to about 200° C. inclusive.

When heat is provided to a temperature lower than about 60° C., the conductive particles may not be melted, and thus, the connection areas of the conductive particles with respect to each pad surfaces may not be sufficient. When heat is provided to a temperature higher than about 200° C., thermal decomposition of the base resin of the conductive adhesive may occur.

Providing heat to the conductive adhesive (S250) may be performed in a high temperature chamber. Providing heat to the conductive adhesive (S250) may include providing heat from a jig unit (JU in FIG. 16C) on which the driving circuit substrate or the panel connecting substrate is mounted.

For example, referring to FIG. 16C, heat may be provided from the jig unit JU on which the driving circuit substrate MB is mounted, or may be provided from a pressing unit PU to which the panel connecting substrate FB is fixed. In some implementations, heat may be provided from both the jig unit JU and the pressing unit PU.

The provided heat may be maintained at a constant temperature. In some implementations, heat may be provided such that the temperature is gradually increased from a first temperature to a second temperature. For example, providing heat to the conductive adhesive (S250) may be performed at a temperature of about 170° C. to about 180° C. inclusive.

The conductive particles CP may be melted by the provided heat. Melted conductive particles CP may be connected to pad surfaces of the first connecting pads FP-1 or the driving pads MP. Surfaces of the melted conductive particles CP may be connected to pad surfaces of the first connecting pads FP-1 or the driving pads MP. For example, conductive particles of a tin alloy having a low melting point are included in the conductive adhesive, and thus the pads may be electrically connected by providing the conductive adhesive even under a low-temperature process condition. Thus, reliability issues may result from a high-temperature process condition may be improved.

The base resin BR of the conductive adhesive AF may be polymerized or cross-linked by the provided heat. For example, by the heat provided to the conductive adhesive AF, the base resin BR of the conductive adhesive AF may be polymerized to be changed into a polymer resin. Also, a cross-linking reaction may occur due to an added curing agent and thereby an adhesive layer may be formed.

In the providing of heat (S250) in FIG. 15, melting of conductive particles, polymerization of the base resin, and curing reaction may all be performed. For example, the melting of conductive particles and the curing of the base resin may be performed in a same step.

Referring to FIG. 15, after providing heat (S250), pressing and bonding the driving circuit substrate and the panel connecting substrate (270) may be carried out. In some implementations, providing heat (S250) and pressing and bonding (S270) may be performed in a same step. For example, referring to FIG. 16C, the driving circuit substrate MB and the panel connecting substrate FB which are disposed between the jig unit JU and the pressing unit PU may be provided with heat and pressure.

The conductive particles CP may be melted by the heat provided at a temperature of the melting point of the conductive particles CP or higher, and the conductive particles CP may be pressed and connected between the driving pad MP and the first connecting pad FP-1 by the provided pressure. Two or more of the conductive particles CP may be bonded to each other to thereby become one conductive particle by the provided pressure. Also, the shapes of the conductive particles CP may be changed under a condition of a high-temperature and a pressure and thereby may be provided in a random shape.

Accordingly, the connection area of the conductive particles CP between the first connecting pad FP-1 and the driving pad MP may be increased by the melted conductive particles CP, and thus the resistance value may be decreased and the adhesion maintaining force may also be increased.

The method for manufacturing a display device according to an embodiment may further include providing a conductive adhesive (S310), aligning the display panel and the panel connecting substrate (S330), providing heat to the conductive adhesive (S350), and pressing and bonding the display panel and the panel connecting substrate (S370). For example, after attaching the panel connecting substrate and the driving circuit substrate, the attaching the display panel and the panel connecting substrate may be performed.

In some implementations, attaching the display panel and the panel connecting substrate and attaching the panel connecting substrate and the driving circuit substrate may be performed at the same time.

The attaching the display panel and the panel connecting substrate may be performed the same as in the method for manufacturing a display device according to an embodiment mentioned above. Providing the conductive adhesive (S310) may include providing the conductive adhesive between the panel pad of the display panel and the second connecting pad of the panel connecting substrate. The conductive adhesive may be provided to at least one pad surface of the panel pad and the second connecting pad.

After providing the adhesive (S310), aligning the display panel and the connecting substrate (S330) may be carried out. The panel pads and the second connecting pads may be disposed to face each other with the conductive adhesive therebetween.

Providing heat to the conductive adhesive disposed between the aligned display panel and the panel connecting substrate (S350) and pressing and bonding the display panel and the panel connecting substrate (S370) may be carried out. Providing heat to the conductive adhesive (S350) and pressing and bonding the display panel and the panel connecting substrate (S370) may be performed in the same step. Providing heat to the conductive adhesive (S350) and pressing and bonding the display panel and the panel connecting substrate (S370) may be performed the same as the providing of heat to the conductive adhesive between the panel connecting substrate and the driving circuit substrate (S250) and the pressing and bonding of the panel connecting substrate and the driving circuit substrate (S270) in the above-mentioned method for manufacturing a display device according to an embodiment.

A method for manufacturing a display device according to an embodiment may further include providing a touch sensor, and providing a touch connecting substrate. Providing the touch sensor may include providing the touch sensor including a touch pad part. Providing the touch connecting substrate may include providing the touch connecting substrate including a first touch connecting pad part and a second touch connecting pad part.

An embodiment may include providing the conductive adhesive on at least one pad part of the first touch connecting pad part of the provided touch connecting substrate and the driving pad part of the provided driving circuit substrate. A method for manufacturing a display device according to an embodiment may further include aligning the driving circuit substrate and the touch connecting substrate, providing heat to the conductive adhesive, and pressing and bonding the aligned driving circuit substrate and the touch connecting substrate.

The conductive adhesive provided on at least one pad part of the driving pad part and the first connecting pad part may be the same as the above-mentioned conductive adhesive. For example, the conductive adhesive may include a base resin and conductive particles of a tin alloy.

Aligning of driving circuit substrate and the touch connecting substrate may include aligning the driving pad part of the driving circuit substrate and the first touch connecting pad part of the touch connecting substrate to face each other. Heat may be provided to the conductive particles provided between the aligned driving pad and the first touch connecting pad part to a temperature of melting point of the conductive particle or higher. In providing heat, melting of the conductive particles and polymerizing and curing of the base resin of the conductive adhesive may be performed.

An embodiment may include pressing and bonding the aligned driving circuit substrate and the touch connecting substrate. Pressing and bonding the driving circuit substrate and the touch connecting substrate and providing heat to the conductive adhesive may be performed in a same step.

A method for manufacturing a display device including the touch sensor according to an embodiment may further include providing the conductive adhesive between the touch pad part and the second touch connecting pad part, providing heat to the conductive adhesive to a temperature of melting point of the conductive particle or higher, and pressing and bonding the aligned touch sensor and the touch connecting substrate.

In the above-mentioned method for manufacturing a display device according to an embodiment, the conductive adhesive including conductive particles having a low melting point is provided, and an area of electrical connection between the conductive particles and the pads may thereby be increased. Accordingly, contact resistance value may be decreased and improve an electrical connection property between the pads and conductive particles may be improved.

Also, the conductive adhesive may be provided in the liquid phase, the conductive adhesive may be provided corresponding to various shapes of pad parts or the display panel. Accordingly, not only the electrical connection characteristic, but also the adhesion characteristics may be improved.

Figure 17A:
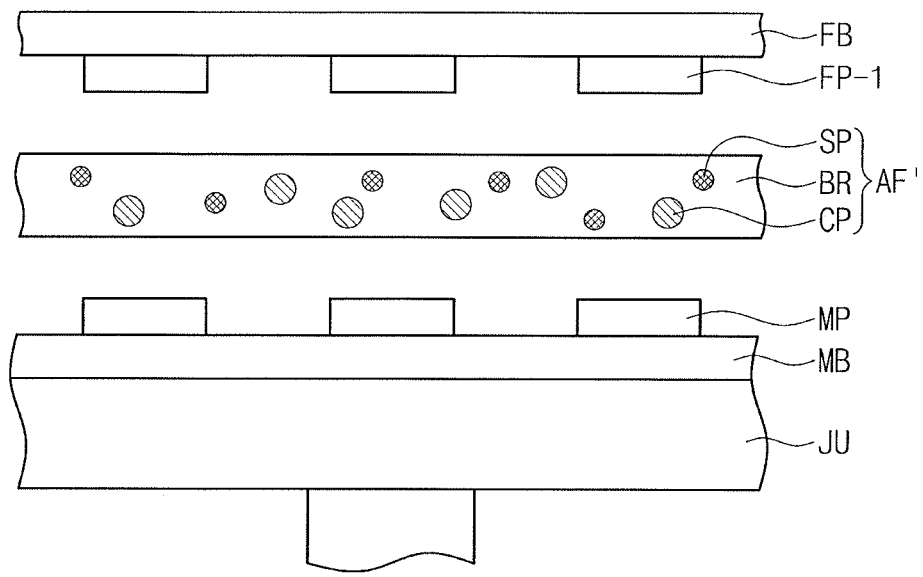
FIGS. 17A to 17B illustrate schematic views illustrating a method for manufacturing a display device according to an embodiment.
Figure 17B:
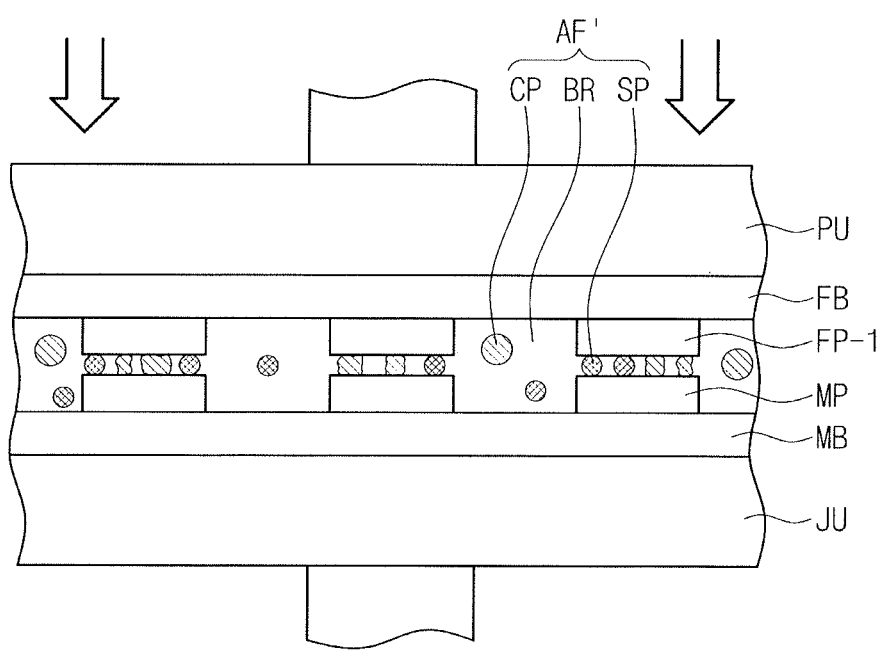

FIGS. 17A to 17B illustrate an example of a method for manufacturing a display device when a conductive adhesive AF' is provided in a film shape.

FIG. 17A illustrates providing a conductive adhesive (S210) in the method for manufacturing the display device according to the embodiment described in FIG. 15. In FIG. 17A, a conductive adhesive AF' may be provided between a driving circuit substrate MB and a panel connecting substrate FB.

The provided conductive adhesive AF' may include a base resin BR, conductive particles CP and spacer particles SP, which are formed of an alloy. The base resin BR may be a thermosetting resin. For example, when the conductive adhesive AF' is provided in a film shape, the base resin BR may be in a temporarily cured state. The base resin BR may be an acryl-based resin, an epoxy-based resin, or a urethane-based resin. The conductive particle CP may be conductive particles of a tin alloy or conductive particles of an indium alloy. The spacer particles SP may be nickel particles.

The average size of the conductive particles CP included in the conductive adhesive AF' may be about 1 μm to about 20 μm inclusive. The spacer particles SP may have an average size of about 1 μm to about 10 μm inclusive. The spacer particles SP may be smaller than the conductive particles CP.

The conductive adhesive AF' provided between the panel connecting substrate FB and the driving circuit substrate MB may be provided after the positions of the panel connecting substrate FB and the driving circuit substrate MB are aligned. For example, the conductive adhesive AF' may be provided after the first connecting pads FP-1 and the driving pads MP are aligned to face each other.

FIG. 17B illustrates providing heat (S250) to the conductive adhesive in the method for manufacturing the display device according to the embodiment described in FIG. 15. In providing heat (S250), heat may be provided up to a temperature greater than the melting point of the conductive particles. The temperature of the provided heat should be lower than the melting point of the spacer particles.

Providing heat (S250) to the conductive adhesive may be performed in a high temperature chamber. Providing heat (S250) to the conductive adhesive may include providing heat from a jig unit JU on which the driving circuit substrate MB or the panel connecting substrate FB is mounted.

For example, referring to FIG. 17B, heat may be provided from the jig unit JU on which the driving circuit substrate MB is mounted, or may be provided from a pressing unit PU to which the panel connecting substrate FB is fixed. Also, heat may be provided from both the jig unit JU and the pressing unit PU.

The conductive particles CP may be melted by provided heat. The melted conductive particles CP may be connected to pad surfaces of the first connecting pads FP-1 or the driving pads MP. Surfaces of the melted conductive particles CP may be connected to pad surfaces of the first connecting pads FP-1 or the driving pads MP. For example, conductive particles of a tin alloy having a low melting point may be included in the conductive adhesive, and thus the pads may be electrically connected by providing the conductive adhesive even under a low-temperature process condition. Also, the spacer particles SP may not be melted by provided heat to maintain the shape thereof. The spacer particles SP may function as a supporter for maintaining gaps between the first connecting pads FP-1 and the driving pads MP. Accordingly, low connection resistance may be maintained, and gaps between the pads may be reduced, and thus electrical characteristics may be improved.

EXAMPLE

Hereinafter, property values between a panel connecting substrate and a driving pad of a driving circuit substrate are compared and illustrated in a display device manufactured by the method for manufacturing a display device in an embodiment described above. The display device and the method for manufacturing the display device to be described in this example are merely examples, and do not limit the scope of embodiments.

The conductive particles used in Examples 1 to 3 include an acryl-based resin, conductive particles of a tin-bismuth alloy, and a polyester-based thermoplastic resin. The conductive adhesive further includes an acrylic acid ester monomer, silica, and a curing agent. The conductive adhesive in a comparative example is one in which nickel (Ni) is used instead of conductive particles of the tin-bismuth alloy. In the comparative example, other configurations of the conductive adhesive were the same as those in Examples 1 and 3.

The conductive particles used in Examples 1 to 3 are alloyed with tin and bismuth by the alloy ratio of about 42:58. In Examples 1 to 3, amounts of conductive particles contained in the tin-bismuth alloy in the conductive adhesive are varied.

Table 1 illustrates the content of the conductive particles in an example and a comparative example, and properties in Examples 1 to 3, which use the method for manufacturing a display device according to an embodiment, compared with a property in a comparative example. Table 1 illustrates adhesive force, contact resistance, and reliability evaluation results.

TABLE 1

| Case | Content of conductive particles (wt %) | Adhesive force | Contact resistance (Ω) | Reliability |
|---|---|---|---|---|
| Example 1 | 15.4 | Good | 0.7 | 0.7 |
| Example 2 | 4.3 | Good | 0.6 | 0.6 |
| Example 3 | 26.7 | Good | 0.6 | 0.6 |
| Comparative example | 15.4 | Good | 0.7 | 5 |

In Table 1, the measured experimental results illustrate the properties of the conductive adhesive applied between the connecting pad of the panel connecting substrate and the driving pad of the driving connecting substrate. The adhesive force in the results of Table 1 represents an adhesion property between the cured conductive adhesive and the pad. The evaluation of adhesive force is performed in such a manner that panel connecting substrate is attached to the panel by using the conductive adhesive, and then the adhesive force is evaluated when the panel connecting substrate is separated in a direction with an angle of about 90 degrees with respect to the panel surface.

The contact resistance represents a resistance value between the pads electrically connected by means of the conductive adhesive. The contact resistance in an example represents resistance values which include a contact resistance value at a connection portion between the panel and the panel connecting substrate and a wiring resistance of the panel and the panel connecting substrate. The reliability is evaluated by whether the conductive adhesive is detached under a high-temperature and high-humidity condition of about 85° C. and about 85%.

Referring to the results of Examples 1 to 3, a superior property was shown when conductive particles containing a tin-bismuth alloy in an amount of about 4 wt % to about 30 wt % inclusive with respect to the total weight of the conductive adhesive were used. By comparison, the comparative example shows defective results in a reliability condition.

From the experimental results of Examples 1 to 3 and comparative example, it may be understood that a display device manufactured by using the conductive adhesive including conductive particles of a tin-bismuth alloy has superior electrical characteristics and adhesion characteristics. It may also be understood that superior characteristics are shown even in a reliability condition.

By way of summation and review, embodiments provide a display device having improved connection reliability by increasing connection areas of conductive particles.

Embodiments provide a method for manufacturing a display device having increased connection areas of conductive particles with respect to pad parts by using a conductive member.

Embodiments provide a display device which further includes spacer particles other than conductive particles in the conductive member to thereby improve connection reliability, and a method for manufacturing the display device.

In a display device and a method for manufacturing the same according to an embodiment, a conductive adhesive including conductive particles of an alloy including at least one of tin or indium are provided and may thereby improve connection quality between a driving circuit substrate and a panel connecting substrate and between a display panel and the panel connecting substrate. In an embodiment, conductive particles each having a low melting point are included to melt the conductive particles under a relatively low-temperature process condition, and thus the connection area between the conductive particles and the pad parts may thereby be increased. Accordingly, a metallic bond is formed between the melted conductive particles and pads and thus the connection reliability may be improved. Thus, resistance values may be reduced in electrical connections between the pads.

Also, in a display device and a method for manufacturing the same according to an embodiment, a conductive adhesive including both conductive particles of an alloy including at least one of tin or indium and the spacer particles are provided, thereby making it possible to improve connection quality between a driving circuit substrate and a panel connecting substrate and between a display panel and the panel connecting substrate.

Also, in a method for manufacturing a display device according to an embodiment, the conductive adhesive may be provided in the liquid phase, and may thereby be provided in a free shape regardless of shapes of pads. The conductive adhesive may be applied to a curved surface and may thereby be used in manufacturing display devices having various shapes.

A display device according to an embodiment includes a conductive adhesive member having conductive particles with increased connection areas and may thus improve the electrical connection between a panel and a connecting circuit substrate or between the connecting circuit substrate and a driving circuit substrate.

A method for manufacturing a display device according to an embodiment includes providing a conductive adhesive disposed between a panel and a connecting circuit substrate or between the connecting circuit substrate and a driving circuit substrate with heat to a melting temperature of conductive particles or higher, and may thus increase the connection areas of the conductive particles and improve the reliability of electrical connection.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:
1. A display device, comprising:
a display panel divided into a display region and a non-display region, the display panel including a panel pad part on the non-display region;
a driving circuit substrate including a driving pad part, the driving circuit substrate to provide a driving signal to the display panel;
a panel connecting substrate including a first connecting pad part and a second pad part, the panel connecting substrate to electrically connect the display panel and the driving circuit substrate;
a first adhesive member between the driving pad part and the first connecting pad part; and
a second adhesive member between the panel pad part and the second connecting pad part, wherein at least the second adhesive member is a conductive adhesive member including a polymer resin and a plurality of conductive particles including at least one of tin or indium, the display panel includes an edge having a curved shape, the panel pad part includes a plurality of panel pads aligned in the curved shape along the edge of the display panel, the second connecting pad part includes a plurality of second connecting pads facing corresponding ones of the plurality of panel pads, and the plurality of second connecting pads are aligned in the curved shape along the edge of the display panel, and the second adhesive member has a shape corresponding to the curved shape of the edge of the display panel.

2. The display device as claimed in claim 1, wherein each of the conductive particles is at least one selected from the group consisting of a tin-silver alloy, a tin-copper alloy, a tin-silver-copper alloy, a tin-bismuth alloy, a tin-zinc alloy, a tin-indium alloy, a tin-indium-bismuth alloy and an indium-bismuth alloy.

3. The display device as claimed in claim 1, wherein each of the conductive particles is made up of a tin-bismuth alloy, the tin-bismuth alloy containing tin in an amount of 37 wt % to 47 wt % inclusive with respect to the total weight thereof, and bismuth in an amount of 53 wt % to 63 wt % inclusive with respect to the total weight thereof.

4. The display device as claimed in claim 1, wherein each of the conductive particles is made up of an indium-bismuth-tin alloy, the indium-bismuth-tin alloy containing indium in an amount of 46 wt % to 56 wt % inclusive with respect to the total weight thereof, bismuth in an amount of 27.5 wt % to 37.5 wt % inclusive with respect to the total weight thereof, tin in an amount of 11.5 wt % to 21.5 wt % inclusive with respect to the total weight thereof.

5. The display device as claimed in claim 1, wherein each of the conductive particles has a melting point of 60° C. to 200° C. inclusive.

6. The display device as claimed in claim 1, wherein the second adhesive member is a conductive adhesive film including conductive metal balls or a conductive adhesive paste including conductive metal balls.

7. The display device as claimed in claim 1, wherein:
the driving pad part includes a plurality of driving pads,
the first connecting pad part includes a plurality of first connecting pads, and
the driving pads face corresponding ones of the first connecting pads.

8. The display device as claimed in claim 7, wherein a connection area of the conductive particles connected to the first connecting pads is 5% to 40% inclusive with respect to an area of one surface of the first connecting pads overlapping the driving pads.

9. The display device as claimed in claim 7, wherein the first adhesive member between the driving pads and the first connecting pads has a thickness of about 1 μm to about 5 μm.

10. The display device as claimed in claim 1, wherein:
the panel pad part includes a plurality of panel pads,
the second connecting pad part includes a plurality of second connecting pads, and
the panel pads face corresponding ones of the second connecting pads.

11. The display device as claimed in claim 10, wherein a connection area of the conductive particles connected to the second connecting pads is 5% to 40% inclusive with respect to an area of one surface of the second connecting pads overlapping the panel pads.

12. The display device as claimed in claim 10, wherein the second adhesive member between the panel pads and the second connecting pads has a thickness of about 1 μm to about 5 μm inclusive.

13. The display device as claimed in claim 1, wherein at least one of the first and second adhesive members further includes a plurality of spacer particles.

14. The display device as claimed in claim 13, wherein:
the driving pad part includes a plurality of driving pads,
the first connecting pad part includes a plurality of first connecting pads, and
the driving pads faces respective ones of the first connecting pads.

15. The display device as claimed in claim 14, wherein:
the first adhesive member is the conductive adhesive member, and
a connection area of the conductive particles connected to the first connecting pads is 1% to 40% inclusive with respect to an area of one surface of the first connecting pads overlapping the panel pads.

16. The display device as claimed in claim 13, wherein:
the panel pad part includes a plurality of panel pads,
the second connecting pad part includes a plurality of second connecting pads, and
the panel pads face corresponding ones of the second connecting pads.

17. The display device as claimed in claim 16, wherein:
the second adhesive member is the conductive adhesive member, and
a connection area of the conductive particles connected to the second connecting pads is 1% to 40% inclusive with respect to an area of one surface of the second connecting pads overlapping the panel pads.

18. The display device as claimed in claim 13, wherein the conductive adhesive member is a conductive adhesive film, or a conductive adhesive paste.

19. The display device as claimed in claim 13, wherein each of the conductive particles is made of at least one selected from the group consisting of a tin-silver alloy, a tin-copper alloy, a tin-silver-copper alloy, a tin-bismuth alloy, a tin-zinc alloy, a tin-indium alloy, a tin-indium-bismuth alloy and an indium-bismuth alloy.

20. The display device as claimed in claim 19, wherein each of the spacer particles is a metallic particle including at least one of gold, silver, copper and palladium, or a non-metallic particle including polymer resin or silicon oxide.

21. The display device as claimed in claim 20, wherein the spacer particles have an average diameter of 1 μm to 10 μm.

22. The display device as claimed in claim 1, further comprising a touch sensor on the display panel, the touch sensor including a touch pad part.

23. The display device as claimed in claim 22, further comprising a touch connecting substrate to electrically connect the touch sensor and the driving circuit substrate, the touch connecting substrate including a first touch connecting pad part and a second touch connecting pad part.

24. The display device as claimed in claim 23, further comprising:
a third adhesive member between the driving pad part and the first touch connecting pad part; and
a fourth adhesive member disposed between the touch pad part and the second touch connecting pad part,
wherein at least one of the third adhesive member and the fourth adhesive member is a conductive adhesive member including a polymer resin and conductive particles including at least one of tin or indium.

25. The display device as claimed in claim 1, wherein the second adhesive member has an arc shape corresponding to part of a circumference of the non-display region.

26. A method for manufacturing a display device, the method comprising:
providing a display panel including a panel pad part;
providing a panel connecting substrate including a first connecting pad part and a second connecting pad part;
providing a driving circuit substrate including a driving pad part;
providing a second adhesive member on the panel pad part and the second connecting pad part, the second adhesive member being a conductive adhesive that includes a base resin and a plurality of conductive particles including at least one of tin or indium;
aligning the driving circuit substrate and the panel connecting substrate such that the driving pad part and the first connecting pad part face each other;
heating the conductive adhesive to a temperature equal to or higher than a melting point of the conductive particles;
pressing and bonding the aligned driving circuit substrate and the panel connecting substrate;
providing the conductive adhesive on at least one pad part of the panel pad part or the second connecting pad part;
aligning the display panel and the panel connecting substrate such that the panel pad part and the second connecting pad part face each other; and
pressing and bonding the aligned display panel and the panel connecting substrate, wherein the display panel includes an edge having a curved shape,
the panel pad part includes a plurality of panel pads aligned in the curved shape along the edge of the display panel,
the second connecting pad part includes a plurality of second connecting pads facing corresponding ones of the plurality of panel pads, and the plurality of second connecting pads are aligned in the curved shape along the edge of the display panel, and
the second adhesive member has a shape corresponding to the curved shape of the edge of the display panel.

27. The method as claimed in claim 26, wherein the melting point of the conductive particles is 60° C. to 200° C. inclusive.

28. The method as claimed in claim 26, wherein the conductive adhesive further includes a thermoplastic polymer resin.

29. The method as claimed in claim 26, wherein the conductive adhesive has a viscosity of 100,000 cps to 700,000 cps inclusive.

30. The method as claimed in claim 26, wherein each of the conductive particles is made of at least one selected from the group consisting of a tin-silver alloy, a tin-copper alloy, a tin-silver-copper alloy, a tin-bismuth alloy, a tin-zinc alloy, a tin-indium alloy, a tin-indium-bismuth alloy and an indium-bismuth alloy.

31. The method as claimed in claim 26, wherein each of the conductive particles is a tin-bismuth alloy containing tin in an amount of 37 wt % to 47 wt % inclusive with respect to the total weight thereof and bismuth in an amount of 53 wt % to 63 wt % inclusive with respect to the total weight thereof.

32. The method as claimed in claim 26, wherein a thermosetting temperature of the base resin is 100° C. to 200° C. inclusive.

33. The method as claimed in claim 26, wherein the weight of the conductive particles with respect to a total weight of the conductive adhesive is 1 wt % to 30 wt % inclusive.

34. The method as claimed in claim 26, wherein providing the conductive adhesive is performed through a dispensing method, a screen printing method, a slit coating method or a dotting method.

35. The method as claimed in claim 26, further comprising
providing a touch sensor including a touch pad part on the display panel;
providing a touch connecting substrate including a first touch connecting pad part and a second touch connecting pad part;
providing the conductive adhesive on at least one pad part of the driving pad part or the first touch connecting pad part;
aligning the driving circuit substrate and the touch connecting substrate such that the driving pad part and the first touch connecting pad part face each other;
heating the conductive adhesive to a temperature equal to or higher than the melting point of the conductive particles; and
pressing and bonding the driving circuit substrate and the touch connecting substrate.

36. The method as claimed in claim 35, further comprising:
providing the conductive adhesive on at least one pad part of the touch pad part or the second touch connecting pad part; and
pressing and bonding the touch sensor and the touch connecting substrate.

37. The method as claimed in claim 26, wherein the second adhesive member has an arc shape corresponding to part of a circumference of the non-display region.

* * * * *